(12) United States Patent
Lee et al.

(10) Patent No.: US 12,557,452 B2
(45) Date of Patent: Feb. 17, 2026

(54) DISPLAY DEVICE

(71) Applicant: LG Display Co., Ltd., Seoul (KR)

(72) Inventors: Jungeun Lee, Seoul (KR); Namkook Kim, Suwon-si (KR); Hwankeon Lee, Seoul (KR); Taegyu Lee, Paju-si (KR)

(73) Assignee: LG Display Co., Ltd., Seoul (KR)

(*) Notice: Subject to any disclaimer, the term of this patent is extended or adjusted under 35 U.S.C. 154(b) by 393 days.

(21) Appl. No.: 18/345,368

(22) Filed: Jun. 30, 2023

(65) Prior Publication Data

US 2024/0014365 A1    Jan. 11, 2024

(30) Foreign Application Priority Data

Jul. 5, 2022  (KR) .................. 10-2022-0082437

(51) Int. Cl.

| | | |
|---|---|---|
| *H01L 27/15* | (2006.01) | |
| *H01L 25/075* | (2006.01) | |
| *H01L 25/16* | (2023.01) | |
| *H01L 29/26* | (2006.01) | |
| *H01L 31/12* | (2006.01) | |
| *H01L 33/00* | (2010.01) | |
| *H10H 20/814* | (2025.01) | |
| *H10H 20/857* | (2025.01) | |
| *H10H 20/01* | (2025.01) | |

(52) U.S. Cl.
CPC ....... *H10H 20/857* (2025.01); *H01L 25/0753* (2013.01); *H01L 25/167* (2013.01); *H10H 20/814* (2025.01); *H10H 20/0364* (2025.01)

(58) Field of Classification Search
CPC ...... H10K 77/10–111; H10K 2102/311; G09G 2380/02
See application file for complete search history.

(56) References Cited

U.S. PATENT DOCUMENTS

| | | | |
|---|---|---|---|
| 2008/0020500 A1 | 1/2008 | Park et al. | |
| 2008/0272992 A1 | 11/2008 | Kwak | |
| 2020/0075823 A1* | 3/2020 | Yang | H10D 86/40 |
| 2020/0161403 A1* | 5/2020 | Jung | H10K 59/35 |

(Continued)

FOREIGN PATENT DOCUMENTS

| | | |
|---|---|---|
| KR | 1020050081540 A | 8/2005 |
| KR | 100542997 B1 | 1/2006 |

(Continued)

*Primary Examiner* — Ismail A Muse
(74) *Attorney, Agent, or Firm* — Seed Intellectual Property Law Group LLP

(57) ABSTRACT

The present disclosure describes a stretchable display device and a method for manufacturing a stretchable display device. The device includes: a substrate, a pattern layer on the substrate and including plate patterns, and line patterns extending from the plate patterns. The device includes pixel circuits respectively disposed on the plate patterns, light-emitting elements respectively connected to the pixel circuits. The device further includes an extension line, a planarization layer, an auxiliary line disposed on the planarization layer and electrically connected to the extension line through a contact hole, and a connection pattern configured to electrically connect the light-emitting element and the auxiliary line through a contact hole in the planarization layer, and electrically connect the light-emitting element and the extension line through contact holes.

14 Claims, 16 Drawing Sheets

(56) References Cited

U.S. PATENT DOCUMENTS

| | | | | |
|---|---|---|---|---|
| 2020/0168590 A1* | 5/2020 | Kim | ................... | H01L 25/0753 |
| 2020/0201393 A1* | 6/2020 | Ahn | ....................... | G09F 9/301 |
| 2021/0012716 A1* | 1/2021 | Kim | ................... | G09G 3/3233 |
| 2021/0217839 A1 | 7/2021 | Choi et al. | | |
| 2022/0013749 A1 | 1/2022 | Kim et al. | | |
| 2022/0122948 A1 | 4/2022 | Kim et al. | | |

FOREIGN PATENT DOCUMENTS

| | | |
|---|---|---|
| KR | 1020130054630 A | 5/2013 |
| KR | 1020150030440 A | 3/2015 |
| KR | 1020170119344 A | 10/2017 |
| KR | 1020190017863 A | 2/2019 |
| KR | 20200057502 A | 5/2020 |
| KR | 1020200126190 A | 11/2020 |
| KR | 1020210090779 A | 7/2021 |
| KR | 1020220007826 A | 1/2022 |
| KR | 1020220049895 A | 4/2022 |

* cited by examiner

DISPLAY DEVICE

CROSS-REFERENCE TO RELATED APPLICATIONS

This application claims the priority of Korean Patent Application No. 10-2022-0082437 filed on Jul. 5, 2022, in the Korean Intellectual Property Office, the disclosure of which is incorporated herein by reference.

BACKGROUND

Technical Field

The present disclosure relates to a display device, and more particularly, to an extendable, stretchable display device.

Description of the Related Art

As display devices used for a monitor of a computer, a TV set, a mobile phone, and the like, there are an organic light-emitting display (OLED) configured to autonomously emit, and a liquid crystal display (LCD) that requires a separate light source.

The range of application of the display devices is diversified from the monitor of the computer and the TV set to personal mobile devices, and studies are being conducted on the display devices having wide display areas and having reduced volumes and weights.

In addition, recently, display devices have been made by forming display parts, lines, and the like on substrates made of flexible plastic materials and having flexibility. The display devices are manufactured to be stretchable in particular directions and variously changeable in shapes, and thus attract attention as next-generation display devices.

BRIEF SUMMARY

One or more embodiments of the present disclosure provide a display device capable of reducing or minimizing damage to an extension line during a process of manufacturing a planarization layer.

One or more embodiments of the present disclosure provide a display device capable of improving contact resistance between a connection pattern and an extension line.

The technical benefits of the present disclosure are not limited to the above-mentioned benefits, and other benefits, which are not mentioned above, can be clearly understood by those skilled in the art from the following descriptions.

According to an aspect of the present disclosure, a display device includes: a stretchable lower substrate; a lower pattern layer disposed on the lower substrate and including a plurality of lower plate patterns, and a plurality of lower line patterns extending from the plurality of lower plate patterns; a plurality of pixel circuits respectively disposed on upper portions of the plurality of lower plate patterns; a lower planarization layer disposed on the plurality of pixel circuits; a plurality of light-emitting elements disposed on the lower planarization layer and respectively connected to the plurality of pixel circuits; a lower extension line disposed on the lower planarization layer while extending to an upper portion of the lower line pattern and electrically connected to the pixel circuit; a first upper planarization layer disposed on the lower planarization layer so as to surround side surfaces of the plurality of light-emitting elements; an auxiliary line disposed on the first upper planarization layer and electrically connected to the lower extension line through a contact hole in the first upper planarization layer; a second upper planarization layer disposed on the first upper planarization layer and configured to planarize an upper portion of the light-emitting element; and a connection pattern configured to electrically connect the light-emitting element and the auxiliary line through a contact hole in the second upper planarization layer, and electrically connect the light-emitting element and the lower extension line through contact holes in the first upper planarization layer and the second upper planarization layer.

According to another aspect of the present disclosure, a method of manufacturing a display device includes: forming a plurality of lower plate patterns and a plurality of lower line patterns on a stretchable lower substrate, the plurality of lower line patterns extending from the plurality of lower plate patterns; forming a plurality of pixel circuits and a lower planarization layer on upper portions of the plurality of lower plate patterns, the lower planarization layer being configured to cover the plurality of pixel circuits; forming a contact hole, through which some of the plurality of pixel circuits are exposed, in the lower planarization layer formed on the upper portions of the plurality of lower plate patterns, and forming a plurality of lower extension lines extending from an upper portion of a part of the exposed pixel circuit to the upper portions of the plurality of lower line patterns; disposing a plurality of light-emitting elements on the lower planarization layer formed on the upper portions of the plurality of lower plate patterns; forming a first upper planarization layer on the lower planarization layer to surround side surfaces of the plurality of light-emitting elements; forming a contact hole, through which a part of the lower extension line is exposed, in the first upper planarization layer, and forming an auxiliary line disposed on the first upper planarization layer and electrically connected to the lower extension line; forming a second upper planarization layer configured to cover an upper portion of the first upper planarization layer, upper portions of the plurality of light-emitting elements, and an upper portion of the auxiliary line; and forming a contact hole through which top surfaces of the plurality of light-emitting elements, a top surface of the auxiliary line, and a top surface of the lower extension line are exposed, and forming a connection pattern configured to connect the plurality of light-emitting elements, the auxiliary line, and the lower extension line.

Other detailed matters of the exemplary embodiments are included in the detailed description and the drawings.

According to the present disclosure, it is possible to suppress oxidation of or damage to the extension line during the process of manufacturing the planarization layer disposed on the extension line.

According to the present disclosure, the connection pattern disposed on the planarization layer having a high-level difference is added, and the electrical connection point on the extension line is added, such that it is possible to improve contact resistance between the connection pattern and the extension line.

According to the present disclosure, the multi-structure including the extension lines is disposed, such that it is possible to reduce resistance of the extension line and improve reliability of the extension line.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
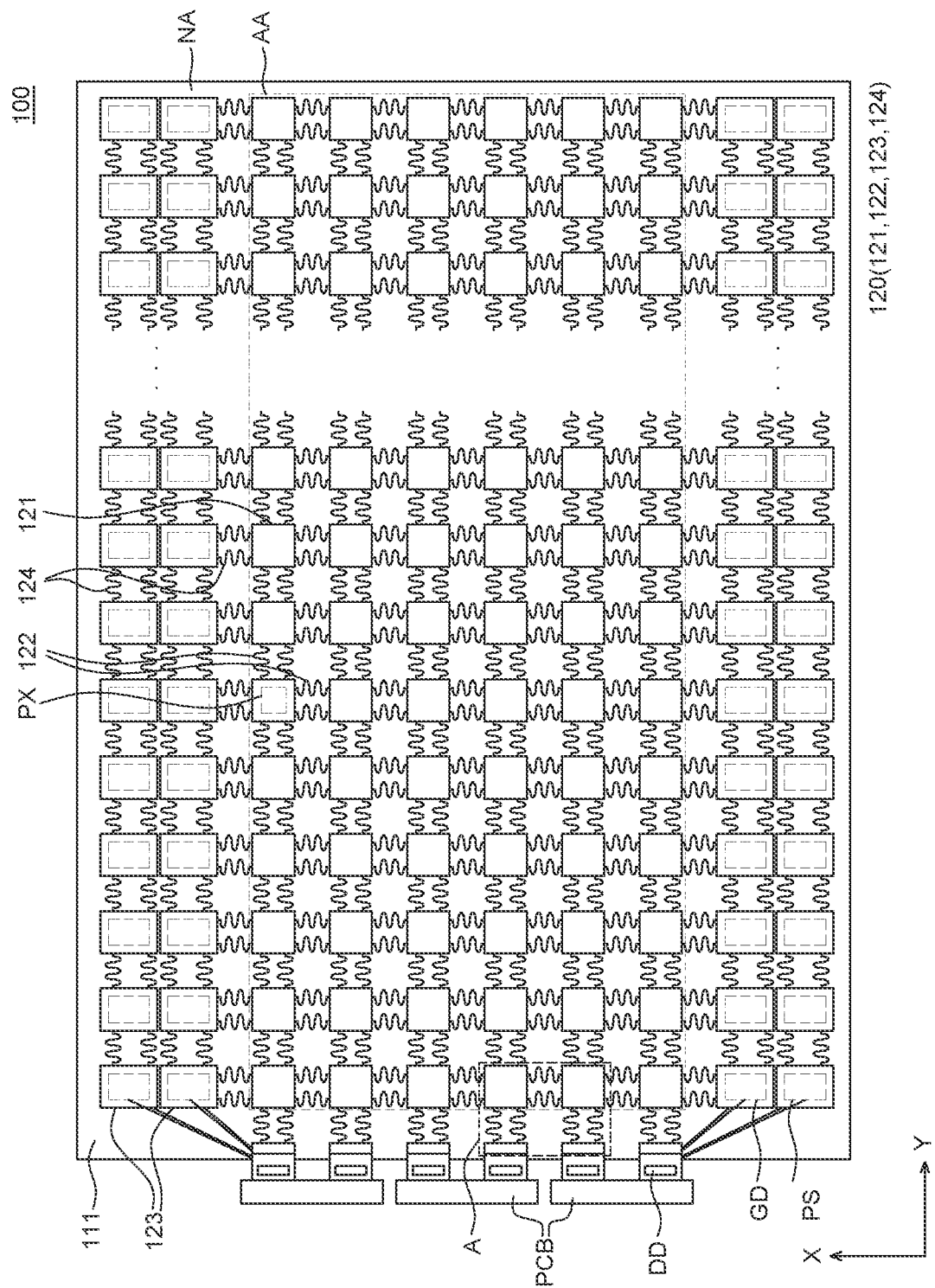
FIG. 1 is a top plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, number of elements, and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as 'including,' 'having,' 'consist of' used herein are generally intended to allow other components to be added unless the terms are used with the term 'only.' Any references to singular may include plural unless expressly stated otherwise.

Components are interpreted to include an ordinary error range even if not expressly stated.

When the position relation between two parts is described using the terms such as 'on,' 'above,' 'below,' 'next,' one or more parts may be positioned between the two parts unless the terms are used with the term 'immediately' or 'directly.'

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to accompanying drawings.

A display device according to an exemplary embodiment of the present disclosure is a display device capable of displaying images even when being bent or stretched. The display device may also be referred to as a stretchable display device, a flexible display device, and an extendable display device. The display device may have not only high flexibility but also stretchability in comparison with a general display device in the related art. Therefore, a user may bend or stretch the display device, and a shape of the display device may be freely changed in accordance with the user's manipulation. For example, in case that the user holds and pulls an end of the display device, the display device may be stretched in a direction in which the user pulls the display device. Alternatively, in case that the user disposes the display device on a non-flat outer surface, the display device may be disposed to be curved along a shape of an outer surface of a wall surface. In addition, when the force applied by the user is eliminated, the display device may be restored back to an original shape.

Stretchable Substrate and Pattern Layer

FIG. 1 is a top plan view of a display device according to an exemplary embodiment of the present disclosure.

Figure 2:
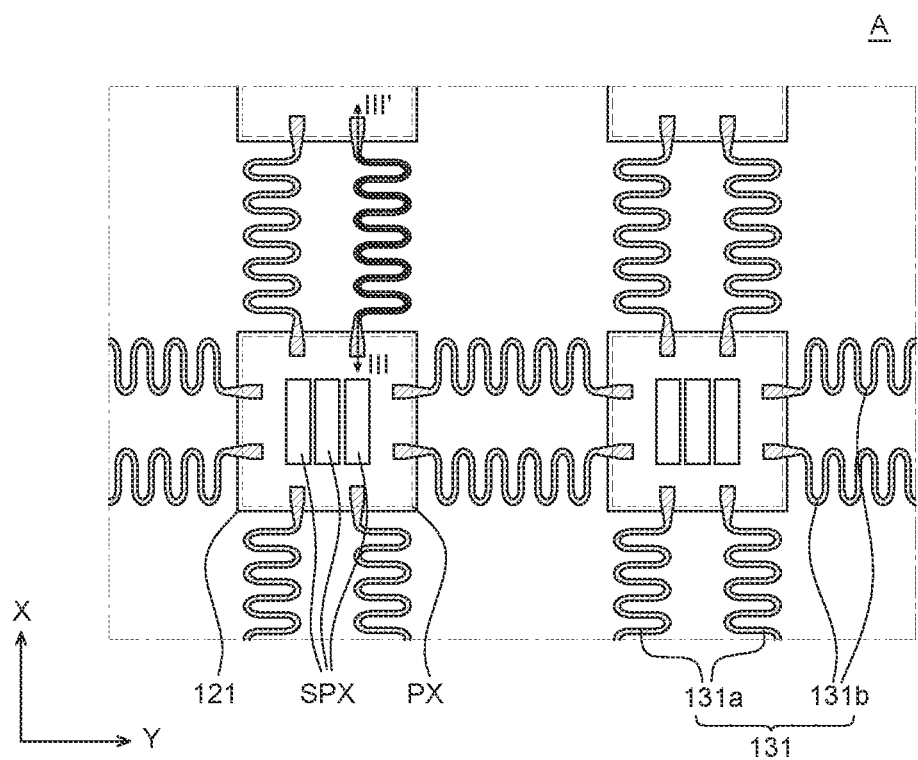
FIG. 2 is an enlarged top plan view of area A of the display device according to the exemplary embodiment of the present disclosure.

FIG. 2 is an enlarged top plan view of area A of the display device according to the exemplary embodiment of the present disclosure.

Figure 3:
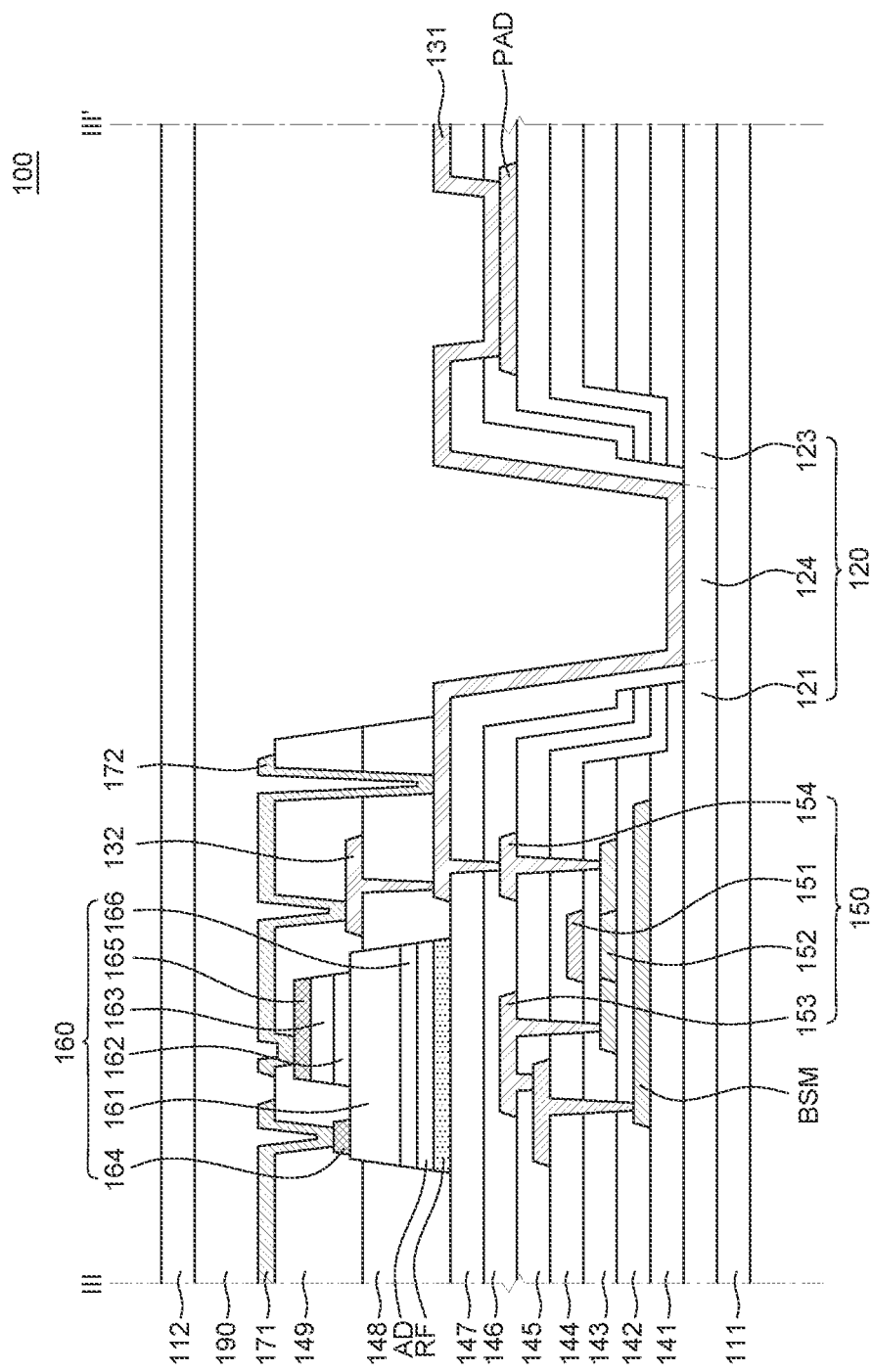
FIG. 3 is a cross-sectional view taken along cutting line III-III' illustrated in FIG. 2.

FIG. 3 is a cross-sectional view taken along cutting line III-III' illustrated in FIG. 2.

Specifically, FIG. 2 is an enlarged top plan view of area A illustrated in FIG. 1.

With reference to FIG. 1, a display device 100 according to an exemplary embodiment of the present disclosure may include a lower substrate 111, a pattern layer 120, a plurality of pixels PX, a gate driver GD, a data driver DD, and a power supply PS. Further, with reference to FIG. 3, the display device 100 according to the exemplary embodiment of the present disclosure may further include a filling layer 190 and an upper substrate 112.

The lower substrate 111 is a substrate configured to support and protect several constituent elements of the display device 100. Further, the upper substrate 112 is a substrate configured to cover and protect several constituent elements of the display device 100. That is, the lower substrate 111 is a substrate configured to support the pattern layer 120 on which the pixel PX, the gate driver GD, and the power supply PS are formed. Further, the upper substrate 112 is a substrate configured to cover the pixel PX, the gate driver GD, and the power supply PS.

The lower substrate 111 and the upper substrate 112 may each be a flexible substrate made of an insulating material that is bendable or stretchable. For example, the lower substrate 111 and the upper substrate 112 may each be made of silicone rubber such as polydimethylsiloxane (PDMS) or elastomer such as polyurethane (PU) and polytetrafluoroethylene (PTFE) and thus have flexibility. Further, the lower substrate 111 and the upper substrate 112 may be made of the same material. However, the present disclosure is not limited thereto. The lower substrate 111 and the upper substrate 112 may be variously modified.

The lower substrate 111 and the upper substrate 112 may each be a flexible substrate that may reversibly expand and contract. Therefore, the lower substrate 111 may also be referred to as a lower stretchable substrate, a lower contractible substrate, a lower extendable substrate, a lower flexible substrate, a lower ductile substrate, a first stretchable substrate, a first contractible substrate, a first extendable substrate, a first flexible substrate, or a first ductile substrate. The upper substrate 112 may also be referred to as an upper stretchable substrate, an upper contractible substrate, an upper extendable substrate, an upper flexible substrate, an upper ductile substrate, a second stretchable substrate, a second contractible substrate, a second extendable substrate, a second flexible substrate, or a second ductile substrate. In addition, the lower substrate 111 and the upper substrate 112 may each have an elastic modulus of several MPa to several hundreds of MPa. Further, a ductile breaking rate of each of the lower substrate 111 and the upper substrate 112 may be 100% or more. In this case, the ductile breaking rate means an elongation ratio at a time point at which a stretching object breaks or cracks. A thickness of the lower substrate may be 10 μm to 1 mm. However, the present disclosure is not limited thereto.

The lower substrate 111 may have a display area (active area AA), and a non-display area (non-active area NA) configured to surround the display area AA. However, the display area AA and the non-display area (non-active area NA) may be referred to for explaining the entire display device without being referred to for explaining only the lower substrate 111.

The display area AA is an area of the display device 100 in which images are displayed. The plurality of pixels PX is disposed in the display area AA. Further, the pixels PX may each include display elements, and various driving elements for operating the display elements. Various driving elements may include at least one thin-film transistor (TFT) and at least one capacitor. However, the present disclosure is not limited thereto. Further, the plurality of pixels PX may each be connected to various lines. For example, the plurality of pixels PX may each be connected to various lines such as gate lines, data lines, high-potential voltage lines, low-potential voltage lines, reference lines, and initialization voltage lines.

The non-display area NA is an area in which no image is displayed. The non-display area NA may be an area adjacent to the display area AA. Further, the non-display area NA may be an area disposed adjacent to the display area AA and configured to surround the display area AA. However, the present disclosure is not limited thereto. The non-display area NA may be an area of the lower substrate 111 that excludes the display area AA. The non-display area NA may be modified and divided into various shapes. Constituent elements for operating the plurality of pixels PX disposed in the display area AA are disposed in the non-display area NA. The gate driver GD and the power supply PS may be disposed in the non-display area NA. Further, a plurality of pads PAD connected to the gate driver GD and the data driver DD may be disposed in the non-display area NA. The pads PAD may be respectively connected to the plurality of pixels PX in the display area AA. The plurality of pads PAD may be electrically connected to a plurality of lower extension lines to be described below and respectively connected to the plurality of pixels PX in the display area AA. The connection between the plurality of pads PAD and the plurality of lower extension lines will be specifically described with reference to FIG. 3.

A plurality of lower plate patterns 121 and a plurality of lower line patterns 122, which are disposed in the display area AA, are disposed on the lower substrate 111. The pattern layer 120, which includes a plurality of outer plate patterns 123 and a plurality of outer line patterns 124 disposed in the non-display area NA, is disposed on the lower substrate 111.

The plurality of lower plate patterns 121 is disposed in the display area AA of the lower substrate 111, and the plurality of pixels PX is formed on the plurality of lower plate patterns 121. Further, the plurality of outer plate patterns 123 may be disposed in the non-display area NA of the lower substrate 111. Further, the gate driver GD and the power supply PS are formed in the plurality of outer plate patterns 123.

The plurality of lower plate patterns 121 and the plurality of outer plate patterns 123 may be disposed in the form of islands spaced apart from one another. The plurality of lower plate patterns 121 and the plurality of outer plate patterns 123 may be individually separated. Therefore, the plurality of lower plate patterns 121 and the plurality of outer plate patterns 123 may be referred to as first island patterns and second island patterns or first individual patterns and second individual patterns.

Specifically, the gate driver GD may be mounted on the plurality of outer plate patterns 123. The gate driver GD may be formed on the outer plate pattern 123 in a gate-in-panel (GIP) manner when various constituent elements on the lower plate pattern 121 are manufactured. Therefore, various circuit components, such as various transistors, capacitors, lines, and the like that constitute the gate driver GD, may be disposed on the plurality of outer plate patterns 123. However, the present disclosure is not limited thereto. The gate driver GD may be mounted in a chip-on-film (COF) manner.

Further, the power supply PS may be mounted on the plurality of outer plate patterns 123. The power supply PS may be formed on the outer plate pattern 123 and provided as a plurality of power blocks patterned when various constituent elements on the lower plate pattern 121 are manufactured. Therefore, the power blocks, which are disposed on different layers, may be disposed on the outer plate pattern 123. That is, lower and upper power blocks may be sequentially disposed on the outer plate pattern 123. Further, a low-potential voltage may be applied to the lower power block, and a high-potential voltage may be applied to the upper power block. Therefore, the low-potential voltage may be supplied to the plurality of pixels PX through the lower power block. Further, the high-potential voltage may be supplied to the plurality of pixels PX through the upper power block.

With reference to FIG. 1, a size of each of the plurality of outer plate patterns 123 may be larger than a size of each of the plurality of lower plate patterns 121. Specifically, a size of each of the plurality of outer plate patterns 123 may be larger than a size of each of the plurality of lower plate patterns 121. As described above, the gate driver GD may be disposed on each of the plurality of outer plate patterns 123.

One stage of the gate driver GD may be disposed on each of the plurality of outer plate patterns 123. Therefore, an area occupied by various circuit components, which constitute one stage of the gate driver GD, is relatively larger than an area occupied by the pixel PX, such that a size of each of the plurality of outer plate patterns 123 may be larger than a size of each of the plurality of lower plate patterns 121.

FIG. 1 illustrates that the plurality of outer plate patterns 123 is disposed at two opposite sides based on a first direction X in the non-display area NA. However, the present disclosure is not limited thereto. The plurality of outer plate patterns 123 may be disposed in any area in the non-display area NA. In addition, the plurality of lower plate patterns 121 and the plurality of outer plate patterns 123 are illustrated as each having a quadrangular shape. However, the present disclosure is not limited thereto. The plurality of lower plate patterns 121 and the plurality of outer plate patterns 123 may be modified in various shapes.

With reference to FIGS. 1 and 3, the pattern layer 120 may further include the plurality of lower line patterns 122 disposed in the display area AA, and the plurality of outer line patterns 124 disposed in the non-display area NA.

The plurality of lower line patterns 122 is patterns disposed in the display area AA and configured to connect the adjacent lower plate patterns 121. The plurality of lower line patterns 122 may be referred to as inner connection patterns. That is, the plurality of lower line patterns 122 extending from the plurality of lower plate patterns is disposed between the plurality of lower plate patterns 121.

The plurality of outer line patterns 124 may be patterns disposed in the non-display area NA and configured to connect the lower plate patterns 121 and the outer plate patterns 123, which are adjacent to one another, or connect the plurality of outer plate patterns 123 adjacent to one another. Therefore, the plurality of outer line patterns 124 may be referred to as outer connection patterns. Further, the plurality of outer line patterns 124 may be disposed between the lower plate patterns 121 and the outer plate patterns 123, which are adjacent to one another, and between the plurality of outer plate patterns 123 adjacent to each other. With reference to FIG. 1, the plurality of lower line patterns 122 and the plurality of outer line patterns 124 each have a curved shape. For example, the plurality of lower line patterns 122 and the plurality of outer line patterns 124 may each have a sine wave shape. However, the shapes of the plurality of lower line patterns 122 and the shapes of the plurality of outer line patterns 124 are not limited thereto. For example, the plurality of lower line patterns 122 and the plurality of outer line patterns 124 may each extend in a zigzag shape. Alternatively, the plurality of lower line patterns 122 and the plurality of outer line patterns 124 may each have various shapes such as a shape in which a plurality of rhombic substrates is connected at vertices. In addition, the numbers and shapes of the plurality of lower line patterns 122 and the plurality of outer line patterns 124 illustrated in FIG. 1 are examples. The plurality of lower line patterns 122 and the plurality of outer line patterns 124 may be variously changed in numbers and shapes in accordance with design.

Further, the plurality of lower plate patterns 121, the plurality of lower line patterns 122, the plurality of outer plate patterns 123, and the plurality of outer line patterns 124 are each a rigid pattern. That is, the plurality of lower plate patterns 121, the plurality of lower line patterns 122, the plurality of outer plate patterns 123, and the plurality of outer line patterns 124 may be more rigid than the lower substrate 111 and the upper substrate 112. Therefore, the plurality of lower plate patterns 121, the plurality of lower line patterns 122, the plurality of outer plate patterns 123, and the plurality of outer line patterns 124 may each have an elastic modulus higher than an elastic modulus of the lower substrate 111. The elastic modulus (modulus of elasticity) refers to a parameter that indicates a ratio of the substrate deformed by stress applied to the substrate. Hardness may increase relatively as the elastic modulus increases relatively. Therefore, the plurality of lower plate patterns 121, the plurality of lower line patterns 122, the plurality of outer plate patterns 123, and the plurality of outer line patterns 124 may be respectively referred to as a plurality of first rigid patterns, a plurality of second rigid patterns, a plurality of third rigid patterns, and a plurality of fourth rigid patterns. The plurality of lower plate patterns 121, the plurality of lower line patterns 122, the plurality of outer plate patterns 123, and the plurality of outer line patterns 124 may each have an elastic modulus that may be 1000 times higher than the elastic modulus of the lower substrate 111 and the upper substrate 112. However, the present disclosure is not limited thereto.

The plurality of lower plate patterns 121, the plurality of lower line patterns 122, the plurality of outer plate patterns 123, and the plurality of outer line patterns 124, which are the plurality of rigid substrates, may each be made of a plastic material having lower flexibility than those of the lower substrate 111 and the upper substrate 112. For example, the plurality of lower plate patterns 121, the plurality of lower line patterns 122, the plurality of outer plate patterns 123, and the plurality of outer line patterns 124 may each be made of at least one of polyimide (PI), polyacrylate, and polyacetate. In this case, the plurality of lower plate patterns 121, the plurality of lower line patterns 122, the plurality of outer plate patterns 123, and the plurality of outer line patterns 124 may be made of the same material. However, the present disclosure is not limited thereto. The plurality of lower plate patterns 121, the plurality of lower line patterns 122, the plurality of outer plate patterns 123, and the plurality of outer line patterns 124 may be made of different materials. The plurality of lower plate patterns 121, the plurality of lower line patterns 122, the plurality of outer plate patterns 123, and the plurality of outer line patterns 124 may be integrated when the plurality of lower plate patterns 121, the plurality of lower line patterns 122, the plurality of outer plate patterns 123, and the plurality of outer line patterns 124 are made of the same material.

In several exemplary embodiments, the lower substrate 111 may be defined as including a plurality of first lower patterns and a second lower pattern. The plurality of first lower patterns may be areas that overlap the plurality of lower plate patterns 121 and the plurality of outer plate patterns 123 of the lower substrate 111. The second lower pattern may be an area that does not overlap the plurality of lower plate patterns 121 and the plurality of outer plate patterns 123.

In addition, the upper substrate 112 may be defined as including a plurality of first upper patterns and a second upper pattern. The plurality of first upper patterns may be areas that overlap the plurality of lower plate patterns 121 and the plurality of outer plate patterns 123 of the upper substrate 112. The second upper pattern may be an area that does not overlap the plurality of lower plate patterns 121 and the plurality of outer plate patterns 123.

In this case, elastic moduli of the plurality of first lower patterns and the first upper pattern may be higher than elastic moduli of the second lower pattern and the second upper pattern. For example, the plurality of first lower patterns and the first upper pattern may be made of the same material as the plurality of lower plate patterns 121 and the plurality of outer plate patterns 123. The second lower pattern and the second upper pattern may each be made of a material having a lower elastic modulus than those of the plurality of lower plate patterns 121 and the plurality of outer plate patterns 123.

That is, the first lower pattern and the first upper pattern may each be made of polyimide (PI), polyacrylate, polyacetate, or the like. The second lower pattern and the second upper pattern may each be made of silicone rubber such as polydimethylsiloxane (PDMS) or elastomer such as polyurethane (PU) or polytetrafluoroethylene (PTFE).

Non-Display Area Driving Element

The gate driver GD is a constituent element configured to supply gate voltages to the plurality of pixels PX disposed in the display area AA. The gate driver GD includes a plurality of stages formed on the plurality of outer plate patterns 123. The stages of the gate driver GD may be electrically connected to one another through a plurality of gate connection lines. Therefore, a gate voltage outputted from any one stage may be transmitted to another stage. Further, the stages may sequentially supply gate voltages to the plurality of pixels PX respectively connected to the stages.

The power supply PS may be connected to the gate driver GD and supply a gate drive voltage and a gate clock voltage. Further, the power supply PS may be connected to the plurality of pixels PX and supply pixel drive voltages to the plurality of pixels PX. In addition, the power supply PS may be formed on the plurality of outer plate patterns 123. That is, the power supply PS may be formed on the outer plate pattern 123 so as to be adjacent to the gate driver GD. Further, the power supplies PS formed on the plurality of outer plate patterns 123 may be electrically connected to the gate driver GD and the plurality of pixels PX. That is, the plurality of power supplies PS formed on the plurality of outer plate patterns 123 may be connected by gate power connection lines and pixel power connection lines. Therefore, the plurality of power supplies PS may each supply the gate drive voltage, the gate clock voltage, and the pixel drive voltage.

A printed circuit board PCB refers to a component that transmits signals and voltages for operating the display elements to the display elements from a controller. Therefore, the printed circuit board PCB may be referred to as a drive substrate. A controller such as IC chips and circuit parts may be mounted on the printed circuit board PCB. In addition, memories, processors, and the like may be mounted on the printed circuit board PCB. Further, the printed circuit board PCB provided in the display device 100 may include a stretchable area and a non-stretchable area to ensure stretchability. Further, IC chips, circuit parts, memories, processors, and the like may be mounted in the non-stretchable area. Lines electrically connected to the IC chips, the circuit parts, the memories, and the processors may be disposed in the stretchable area.

The data driver DD is a constituent element configured to supply data voltages to the plurality of pixels PX disposed in the display area AA. The data driver DD may be configured in the form of an IC chip, and thus referred to as a data integrated circuit (D-IC). Further, the data driver DD may be mounted in a non-stretchable area of the printed circuit board PCB. That is, the data driver DD may be mounted on the printed circuit board PCB in a chip-on-board (COB) manner. However, FIG. 1 illustrates that the data driver DD is mounted in a chip-on-film (COF) manner. However, the present disclosure is not limited thereto. The data driver DD may be mounted in a chip-on-board (COF) manner, a chip-on-glass (COG) manner, a tape carrier package (TCP) manner, and the like.

In addition, FIG. 1 illustrates that a single data driver DD is disposed to correspond to one row of lower plate patterns 121 disposed in the display area AA. However, the present disclosure is not limited thereto. That is, the single data driver DD may be disposed to correspond to a plurality of rows of lower plate patterns 121.

With reference to FIGS. 2 and 3, the pixel PX including a plurality of subpixels SPX is disposed on the plurality of lower plate patterns 121. Further, the subpixels SPX may each include a light-emitting element 160, and a pixel circuit including a driving transistor 150, a switching transistor, and the like for operating the light-emitting element 160. That is, a plurality of pixel circuits may each be disposed on an upper portion of the lower plate pattern 121. The plurality of pixel circuits may be respectively connected to the plurality of light-emitting elements 160. However, in the subpixel SPX, the light-emitting element 160 is not limited to an LED, but may be changed to an organic light-emitting diode. Further, the plurality of subpixels SPX may include a red subpixel, a green subpixel, and a blue subpixel. However, the present disclosure is not limited thereto. The colors of the plurality of subpixels SPX may be variously changed, as necessary. In addition, although not illustrated in FIG. 3, the pixel circuit may further include the switching transistor.

The plurality of subpixels SPX may be connected to a plurality of lower extension lines 131. More specifically, the plurality of lower extension lines 131 may include a first lower extension line 131a and a second lower extension line 131b. The plurality of subpixels SPX may be electrically connected to the first lower extension line 131a extending in the first direction X. Further, the plurality of subpixels SPX may be electrically connected to a second lower extension line 132b extending in a second direction Y.

Hereinafter, a cross-sectional structure of the display area AA will be specifically described with reference to FIG. 3.

With reference to FIG. 3, a plurality of inorganic insulation layers is disposed on the plurality of lower plate patterns 121. For example, the plurality of inorganic insulation layers may include a buffer layer 141, an active buffer layer 142, a gate insulation layer 143, a first interlayer insulation layer 144, a second interlayer insulation layer 145, and a passivation layer 146. However, the present disclosure is not limited thereto. Various inorganic insulation layers may be additionally disposed on the plurality of lower plate patterns 121. Alternatively, one or more of the buffer layer 141, the active buffer layer 142, the gate insulation layer 143, the first interlayer insulation layer 144, the second interlayer insulation layer 145, and the passivation layer 146, which are inorganic insulation layers, may be excluded.

Specifically, the buffer layer 141 is disposed on the plurality of lower plate patterns 121. The buffer layer 141 is formed on the plurality of lower plate patterns 121 in order to protect various constituent elements of the display device 100 from penetration of moisture ($H_2O$) and oxygen ($O_2$) from the outside of the lower substrate 111 and the plurality of lower plate patterns 121. The buffer layer 141 may be made of an insulating material. For example, the buffer layer 141 may be configured as a single layer or multilayer made of at least one of silicon nitride ($SiN_x$), silicon oxide ($SiO_x$), and silicon oxynitride ($SiON$). However, the buffer layer 141 may be excluded in accordance with the structure or properties of the display device 100.

In this case, the buffer layer 141 may be formed only in an area in which the lower substrate 111 overlaps the plurality of lower plate patterns 121 and the plurality of outer plate patterns 123. As described above, because the buffer layer 141 may be made of an inorganic material, the display device 100 may be easily damaged or crack during a process of stretching the display device 100. Therefore, the buffer layer 141 may be formed only on upper portions of the plurality of lower plate patterns 121 and upper portions of the plurality of outer plate patterns 123 by being patterned in shapes of the plurality of lower plate patterns 121 and shapes of the plurality of outer plate patterns 123 without being formed in an area between the plurality of lower plate patterns 121 and the plurality of outer plate patterns 123. Therefore, in the display device 100 according to the exemplary embodiment of the present disclosure, the buffer layer 141 is formed only in the area that overlaps the plurality of lower plate patterns 121 and the plurality of outer plate patterns 123 that are rigid patterns. Therefore, it is possible to suppress damage to various constituent elements of the display device 100 even though the display device 100 is deformed by being curved or stretched.

With reference to FIG. 3, a barrier metal layer BSM is disposed on the buffer layer 141. The barrier metal layer BSM is a layer serving to protect an active layer 152. The barrier metal layer BSM may be disposed on a buffer layer 113 so as to overlap the active layer 152 of the driving transistor 150. In a cross-sectional view, a width of the barrier metal layer BSM may be equal to or larger than a width of the active layer 152.

The barrier metal layer BSM may be made of various metallic materials. As illustrated in FIG. 3, the barrier metal layer BSM may be connected to a source electrode 153 and apply a constant voltage. However, the barrier metal layer BSM may be in a floating state in which no voltage is applied. However, the present disclosure is not limited thereto.

With reference to FIG. 3, the active buffer layer 142 is disposed on the barrier metal layer BSM and the buffer layer 141. The active buffer layer 142 is an insulation layer configured to insulate the barrier metal layer BSM and the active layer 152 of the driving transistor 150. Like the buffer layer 141, the active buffer layer 142 may be made of an inorganic material. For example, the active buffer layer 142 may be configured as a single layer made of silicon nitride (SiNx) or silicon oxide (SiOx) that is an inorganic material. Alternatively, the active buffer layer 142 may be configured as a multilayer made of silicon nitride (SiNx) or silicon oxide (SiOx). However, the present disclosure is not limited thereto.

With reference to FIG. 3, the driving transistor 150 including a gate electrode 151, the active layer 152, the source electrode 153, and a drain electrode 154 is formed on the active buffer layer 142.

First, with reference to FIG. 1, the active layer 152 of the driving transistor 150 is disposed on the active buffer layer 142. For example, the active layer 152 of the driving transistor 150 may be made of an oxide semiconductor. The active layer 152 of the driving transistor 150 may be made of amorphous silicon (a-Si), polycrystalline silicon (poly-Si), an organic semiconductor, or the like.

The gate insulation layer 143 is disposed on the active layer 152 of the driving transistor 150. The gate insulation layer 143 is a layer configured to electrically insulate the gate electrode 151 of the driving transistor 150 and the active layer 152 of the driving transistor 150. Further, the gate insulation layer 143 may be made of an insulating material. For example, the gate insulation layer 143 may be configured as a single layer made of silicon nitride (SiNx) or silicon oxide (SiOx) that is an inorganic material. Alternatively, the gate insulation layer 143 may be configured as a multilayer made of silicon nitride (SiNx) or silicon oxide (SiOx). However, the present disclosure is not limited thereto.

The gate electrode 151 of the driving transistor 150 is disposed on the gate insulation layer 143. Further, the gate electrode 151 of the driving transistor 150 is disposed on the gate insulation layer 143 and spaced apart from the active layer 152. Further, the gate electrode 151 of the driving transistor 150 overlaps the active layer 152 of the driving transistor 150.

The gate electrode 151 of the driving transistor 150 may be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the gate electrode 151 of the driving transistor 150 may be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

The first interlayer insulation layer 144 is disposed on the gate electrode 151 of the driving transistor 150. Like the buffer layer 141, the first interlayer insulation layer 144 may be made of an inorganic material. For example, the first interlayer insulation layer 144 may be configured as a single layer made of silicon nitride (SiNx) or silicon oxide (SiOx) that is an inorganic material. Alternatively, the first interlayer insulation layer 144 may be configured as a multilayer made of silicon nitride (SiNx) or silicon oxide (SiOx). However, the present disclosure is not limited thereto.

The second interlayer insulation layer 145 is disposed on the first interlayer insulation layer 144. The second interlayer insulation layer 145 insulates the gate electrode 151 of the driving transistor 150 and the source electrode 153 and the drain electrode 154 of the driving transistor 150. Like the buffer layer 141, the second interlayer insulation layer 145 may be made of an inorganic material. For example, the second interlayer insulation layer 145 may be configured as a single layer made of silicon nitride (SiNx) or silicon oxide (SiOx) that is an inorganic material. Alternatively, the second interlayer insulation layer 145 may be configured as a multilayer made of silicon nitride (SiNx) or silicon oxide (SiOx). However, the present disclosure is not limited thereto.

The source electrode 153 and the drain electrode 154 of the driving transistor 150 are disposed on the second interlayer insulation layer 145. The source electrode 153 and the drain electrode 154 of the driving transistor 150 may be disposed on the same layer and spaced apart from each other. The source electrode 153 and the drain electrode 154 may be electrically connected to the active layer 152 while adjoining the active layer 152.

The source electrode 153 and the drain electrode 154 may each be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the source electrode 153 and the drain electrode 154 may each be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

In addition, in the present specification, the driving transistor 150 has been described as having a coplanar structure. However, various transistors having a staggered structure may also be used. Further, in the present specification, the transistor may have not only a top gate structure but also a bottom gate structure.

Meanwhile, with reference to FIG. 3, the plurality of pads PAD may be disposed on the second interlayer insulation layer 144. The plurality of pads PAD may be formed on the same layer as the source electrode 153 or the drain electrode 154. The plurality of pads PAD may be exposed through contact holes formed in the passivation layer 146 and a lower planarization layer 147. Further, the lower extension line 131, which will be described below, may be disposed on the plurality of pads PAD, and the plurality of pads PAD may be connected to the lower extension line 131.

With reference to FIGS. 2 and 3, the plurality of pads PAD may be provided in the non-display area NA and disposed on the second interlayer insulation layer 144. Meanwhile, the plurality of pads PAD may each be disposed on the lower plate pattern 121 disposed to transmit signals to the plurality of subpixels SPX. In this case, the plurality of pads PAD may be one of a gate pad, a data pad, and a voltage pad. However, the present disclosure is not limited thereto.

The gate pad is a pad configured to transmit gate voltages to the plurality of subpixels SPX. For example, the gate pad may be connected to the first lower extension line 131a through the contact hole. Further, the gate voltage supplied from the first lower extension line 131a may be transmitted from the gate pad to the gate electrode of the switching transistor through a line formed on the lower plate pattern 121.

The data pad is a pad configured to transmit data voltages to the plurality of subpixels SPX. For example, the data pad may be connected to the second lower extension line 131b through the contact hole. Further, the data voltage supplied from the second lower extension line 131b may be transmitted from the data pad to the source electrode 153 of the driving transistor 150 through a non-extension line formed on the lower plate pattern 121.

The voltage pad is a pad configured to transmit low-potential voltages or high-potential voltages to the plurality of subpixels SPX. For example, the low-potential voltage supplied from the voltage pad may be transmitted to a first electrode 164 of the light-emitting element. Further, the high-potential voltage supplied from the voltage pad may be transmitted to the source electrode 153 of the driving transistor 150.

The voltage pad, the gate pad, and the data pad may be made of the same material as the source electrode 153 and the drain electrodes 154 and 164. However, the present disclosure is not limited thereto.

With reference to FIG. 3, the passivation layer 146 is formed on the driving transistor 150. That is, the passivation layer 145 covers the driving transistor 150 to protect the driving transistor 150 from penetration of moisture and oxygen. The passivation layer 145 may be made of an inorganic material and configured as a single layer or multilayer. However, the present disclosure is not limited thereto.

Further, the active buffer layer 142, the gate insulation layer 143, the first interlayer insulation layer 144, the second interlayer insulation layer 145, and the passivation layer 146 may be patterned and formed only in an area that overlaps the plurality of lower plate patterns 121. Like the buffer layer 141, the active buffer layer 142, the gate insulation layer 143, the first interlayer insulation layer 144, the second interlayer insulation layer 145, and the passivation layer 146 may each be made of an inorganic material. For this reason, the display device 100 may easily crack and be deformed during the process of stretching the display device 100. Therefore, the active buffer layer 142, the gate insulation layer 143, the first interlayer insulation layer 144, the second interlayer insulation layer 145, and the passivation layer 146 may be formed only on the upper portions of the plurality of lower plate patterns 121 by being patterned in the shapes of the plurality of lower plate patterns 121 without being formed in the area between the plurality of lower plate patterns 121.

The lower planarization layer 147 is formed on the passivation layer 146. The lower planarization layer 147 planarizes an upper portion of the driving transistor 150. The lower planarization layer 147 may be configured as a single layer or a plurality of layers and made of an organic material. Therefore, the lower planarization layer 147 may be referred to as an organic insulation layer. For example, the lower planarization layer 147 may be made of an acrylic-based organic material. However, the present disclosure is not limited thereto.

With reference to FIG. 3, the lower planarization layer 147 may be disposed on the plurality of lower plate patterns 121 and cover top surfaces and side surfaces of the buffer layer 141, the active buffer layer 142, the gate insulation layer 143, the first interlayer insulation layer 144, the second interlayer insulation layer 145, and the passivation layer 146. Further, the lower planarization layer 147, together with the plurality of lower plate patterns 121, surrounds the buffer layer 141, the active buffer layer 142, the gate insulation layer 143, the first interlayer insulation layer 144, the second interlayer insulation layer 145, and the passivation layer 146. Specifically, the lower planarization layer 147 may be disposed to partially cover a top surface and side surface of the passivation layer 146, a side surface of the first interlayer insulation layer 144, a side surface of the second interlayer insulation layer 145, a side surface of the gate insulation layer 143, a side surface of the active buffer layer 142, a side surface of the buffer layer 141, and top surfaces of the plurality of lower plate patterns 121. Therefore, the lower planarization layer 147 may compensate for a level difference between the side surfaces of the buffer layer 141, the active buffer layer 142, the gate insulation layer 143, the first interlayer insulation layer 144, the second interlayer insulation layer 145, and the passivation layer 146, thereby increasing bonding strength of the lower extension line 131 disposed on the top surface of the lower planarization layer 147 and the side surface of the lower planarization layer 147.

With reference to FIGS. 2 to 3, the lower extension line 131 means a line that electrically connects the plurality of pixels PX on the plurality of lower plate patterns 121. The plurality of lower extension lines 131 is disposed on the plurality of outer line patterns 124. Further, the lower extension line 131 may be disposed on the lower planarization layer 147 and extend to the plurality of outer line patterns 124 and the plurality of pads PAD so as to be electrically connected to the plurality of pads PAD. Therefore, the lower extension line 131 may electrically connect the pixel circuit and the plurality of pads PAD.

Meanwhile, the lower extension line 131 may also be disposed on the plurality of lower line patterns 122 disposed in the area between the plurality of lower plate patterns 121 in the display area AA. In this case, with reference to FIG.

2, the lower line pattern 122 is not disposed in the area in which the lower extension line 131 is not disposed, among the areas between the plurality of lower plate patterns 121.

With reference to FIG. 2, the lower extension line 131 includes the first lower extension line 131a and the second lower extension line 131b. The first lower extension line 131a and the second lower extension line 131b are disposed between the plurality of lower plate patterns 121. Specifically, the first lower extension line 131a means a line of the lower extension line 131 that extends in the X-axis direction between the plurality of lower plate patterns 121. The second lower extension line 131b means a line of the lower extension line 131 that extends in the Y-axis direction between the plurality of lower plate patterns 121.

The lower extension line 131 may be configured as a layered structure made of a metallic material such as copper (Cu), aluminum (Al), titanium (Ti), or molybdenum (Mo) or a metallic material such as copper/molybdenum-titanium (Cu/Moti) or titanium/aluminum/titanium (Ti/Al/Ti). However, the present disclosure is not limited thereto.

In the case of a general display panel of a display device, various lines such as a plurality of gate lines and a plurality of data lines are disposed between a plurality of subpixels and extend in straight shapes. The plurality of subpixels is connected to the single signal line. Therefore, in the case of the general display panel of the display device, various lines such as the gate line, the data line, the high-potential voltage line, and the reference line extend in a direction from one side to the other side of the display panel of the organic light-emitting display device without interruption on the substrate.

In contrast, in the case of the display device 100 according to the exemplary embodiment of the present disclosure, various lines such as gate lines, data lines, high-potential voltage lines, reference lines, and initialization voltage lines, which are straight non-extension lines that may be considered as being used for the general display panel of the display device, are disposed only on the plurality of lower plate patterns 121 and the plurality of outer plate patterns 123. That is, in the display device 100 according to the exemplary embodiment of the present disclosure, the straight non-extension line is disposed only on the plurality of lower plate patterns 121 and the plurality of outer plate patterns 123.

In the display device 100 according to the exemplary embodiment of the present disclosure, the pads on the two adjacent lower plate patterns 121 or the pads PAD disposed in the non-display area NA may be connected by the lower extension line 131. Therefore, the lower extension line 131 electrically connects various pads PAD such as gate pads or data pads on the two adjacent lower plate patterns 121.

Therefore, the display device 100 according to the exemplary embodiment of the present disclosure may include the plurality of lower extension lines 131 to electrically connect various non-extension lines such as gate lines, data lines, high-potential voltage lines, and reference lines between the plurality of lower plate patterns 121. For example, a gate line, which is the non-extension line, may be disposed on the plurality of lower plate patterns 121 disposed adjacent to one another in the first direction X, and gate pads may be disposed at two opposite ends of the gate line. In this case, the plurality of gate pads on the plurality of lower plate patterns 121 disposed adjacent to one another in the first direction X may be connected to one another by the first lower extension line 131a that serves as a gate line. Therefore, the gate line disposed on the plurality of lower plate patterns 121 and the first lower extension line 131a disposed on the lower line pattern 122 may serve as a single gate line. The gate line may be referred to as a scan signal line. In addition, among all the various lines that may be included in the display device 100, the line extending in the first direction X, for example, the light-emitting signal line, the low-potential voltage line, and the high-potential voltage line may also be electrically connected by the first lower extension line 131a, as described above.

With reference to FIG. 2, the first lower extension line 131a may connect the non-extension lines or the gate pads on the two lower plate patterns 121 disposed side by side, among the gate pads on the plurality of lower plate patterns 121 disposed adjacent to one another in the first direction X. Alternatively, the first lower extension line 131a may serve as the gate line, the light-emitting signal line, the high-potential voltage line, or the low-potential voltage line. However, the present disclosure is not limited thereto. The gate pads on the plurality of lower plate patterns 121 disposed in the first direction X may be connected by the first lower extension line 131a, which serves as a gate line, and receive a single gate voltage.

Further, with reference to FIG. 2, the second lower extension line 131b may connect the non-extension lines or the data pads on the two lower plate patterns 121 disposed side by side, among the data pads on the plurality of lower plate patterns 121 disposed adjacent to one another in the second direction Y. The second lower extension line 131b may serve as the data line, the high-potential voltage line, the low-potential voltage line, or the reference line. However, the present disclosure is not limited thereto. The lines on the plurality of lower plate patterns 121 disposed in the second direction Y may be connected by the plurality of second lower extension lines 131b, which serves as data lines, and receive a single data voltage.

As illustrated in FIG. 3, the lower extension line 131 may be disposed to adjoin the top surface and the side surface of the lower planarization layer 147 disposed on the lower plate pattern 121. Further, the lower extension line 131 may extend to the top surface of the outer line pattern 124. That is, the lower extension line 131 may be disposed on the lower planarization layer 147 and extend to an upper portion of the outer line pattern 124.

With reference to FIG. 3, a reflective layer RF is disposed on the lower planarization layer 147. The reflective layer RF is a layer that reflects light beams, which are emitted toward the lower substrate 111 among the light beams emitted from the light-emitting element 160, to an upper portion of the display device 100 so that the light beams propagate to the outside. The reflective layer RF may be made of a metallic material having high reflectance.

A bonding layer AD is disposed on the reflective layer RF. The bonding layer AD is a layer for bonding the light-emitting element 160 onto the reflective layer RF. The bonding layer AD may insulate the light-emitting element 160 and the reflective layer RF made of a metallic material. The bonding layer AD may be made of a thermosetting or photocurable material. However, the present disclosure is not limited thereto. FIG. 3 illustrates that the bonding layer AD covers only a top surface of the reflective layer RF. However, the bonding layer AD may be disposed to cover both the top surface and a side surface of the reflective layer RF. However, an arrangement position of the bonding layer AD is not limited thereto.

The light-emitting element 160 is disposed on the bonding layer AD. The light-emitting element 160 is disposed to overlap the reflective layer RF. The light-emitting element 160 includes a first semiconductor layer 161, an active layer 162, a second semiconductor layer 163, the first electrode 164, a second electrode 165, and an undoped semiconductor layer 166. A light-emitting element 170 of the display device 100 according to the exemplary embodiment of the present disclosure has a lateral structure in which the first electrode 164 and the active layer 162 are disposed on an upper portion of the first semiconductor layer 161, and the second semiconductor layer 163 and the second electrode 165 are sequentially positioned on an upper portion of the active layer 162.

The undoped semiconductor layer 166 is a layer made of undoped gallium nitride (un-GaN). The undoped semiconductor layer 166 may be disposed between a growth substrate and the first semiconductor layer 161 at the time of forming the light-emitting element 160, and the undoped semiconductor layer 166 may serve as a buffer layer for the first semiconductor layer 161.

The first semiconductor layer 161 may be an n-type layer made of an n-type semiconductor material. The first semiconductor layer 161 may be formed by injecting n-type impurities into gallium nitride (GaN) having excellent crystallinity.

The active layer 162 is disposed on the first semiconductor layer 161. The active layer 162 may be a light-emitting layer provided in the light-emitting element 160 and configured to emit light. The active layer 162 may be made of a nitride semiconductor, e.g., indium gallium nitride (InGaN).

The second semiconductor layer 163 is disposed on the active layer 162. The second semiconductor layer 163 may be a p-type layer made of a p-type semiconductor material. The second semiconductor layer 163 may be formed by injecting p-type impurities into gallium nitride (GaN).

As described above, the light-emitting element 160 according to the exemplary embodiment of the present disclosure is manufactured by stacking the first electrode 164 and the active layer 162 on the upper portion of the first semiconductor layer 161 and then sequentially forming the second semiconductor layer 163 and the second electrode 165 on the upper portion of the active layer 162.

Specifically, the light-emitting element 160 may be manufactured by sequentially stacking the first semiconductor layer 161, the active layer 162, and the second semiconductor layer 163, etching predetermined portions of the active layer 162 and the second semiconductor layer 163, and forming the first electrode 164 and the second electrode 165. In this case, the predetermined portion is a space in which the first electrode 164 and the second electrode 165 are spaced apart from each other. The predetermined portion may be etched so that a part of the first semiconductor layer 161 is exposed. In other words, a surface of the light-emitting element 160, on which the first electrode 164 and the second electrode 165 are to be disposed, may be a surface having different height levels instead of a planarized surface. Therefore, the second electrode 165 is disposed on the second semiconductor layer 163, the first electrode 164 is disposed on the first semiconductor layer 161, and the first electrode 164 and the second electrode 165 are disposed to be spaced apart from each other at different height levels. Therefore, the first electrode 164 may be disposed to be closer to the reflective layer RF than the second electrode 165 to the reflective layer RF.

The first electrode 164 and the second electrode 165 may each be made of an electrically conductive material, e.g., transparent conducting oxide. In addition, the first electrode 164 and the second electrode 165 may be made of the same material. However, the present disclosure is not limited thereto.

With reference to FIG. 3, an upper planarization layer is disposed on the lower planarization layer 147 and the light-emitting element 160. The upper planarization layer is a layer configured to planarize a top surface of the light-emitting element 160. That is, the upper planarization layer may be disposed to planarize the top surface of the light-emitting element 160 disposed on an upper portion of the lower planarization layer 147. In this case, the upper planarization layer includes two or more layers including a first upper planarization layer 148 and a second upper planarization layer 149.

Specifically, the first upper planarization layer 148 is disposed on the lower planarization layer 147. The first upper planarization layer 148 is disposed on the lower planarization layer 147 and surrounds a side surface of the light-emitting element 160. That is, the first upper planarization layer 148 may be disposed to partially expose the top surface and the side surface of the light-emitting element 160. In addition, the first upper planarization layer 148 may be disposed to cover a part of the lower extension line 131 disposed on the lower planarization layer 147.

The first upper planarization layer 148 may be made of an organic material. Therefore, the first upper planarization layer 148 may be referred to as an organic insulation layer. The first upper planarization layer 148 may be made of the same material as the lower planarization layer 147. For example, the first upper planarization layer 148 may be made of an acrylic-based organic material. However, the present disclosure is not limited thereto.

An auxiliary line 132 may be formed on the first upper planarization layer 148. The auxiliary line 132 may be formed on the first upper planarization layer 148 and spaced apart from the light-emitting element 160. The auxiliary line 132 may be electrically connected to the lower extension line 131. Specifically, the auxiliary line 132 may be disposed on the first upper planarization layer 148 and electrically connected to the lower extension line 131 through a contact hole in the first upper planarization layer 148. Therefore, the auxiliary line 132 may be disposed on a plane different from a plane on which the lower extension line 131 is disposed.

The auxiliary line 132 may be configured as a layered structure made of a metallic material such as copper (Cu), aluminum (Al), titanium (Ti), or molybdenum (Mo) or a metallic material such as copper/molybdenum-titanium (Cu/Moti) or titanium/aluminum/titanium (Ti/Al/Ti). However, the present disclosure is not limited thereto.

The second upper planarization layer 149 may be formed on an upper portion of the first upper planarization layer 148, an upper portion of the light-emitting element 160, and an upper portion of the auxiliary line 132. Specifically, the second upper planarization layer 149 may be disposed to partially cover the top surface and the side surface of the light-emitting element 160 exposed from the first upper planarization layer 148 and cover the top surface and the side surface of the auxiliary line 132. Therefore, the second upper planarization layer 149 may planarize the upper portion of the light-emitting element 160 and the upper portion of the auxiliary line 132.

The second upper planarization layer 149 may be made of an organic material. Therefore, the second upper planarization layer 149 may be referred to as an organic insulation layer. The second upper planarization layer 149 may be made of the same material as the lower planarization layer 147. For example, the second upper planarization layer 149 may be made of an acrylic-based organic material. However, the present disclosure is not limited thereto.

A first connection pattern 171 and a second connection pattern 172 are disposed on the second upper planarization layer 149.

The first connection pattern 171 electrically connects the light-emitting element 160 and a common line that is a line shared by the plurality of light-emitting elements 160. Specifically, the first connection pattern 171 is connected to the common line through contact holes formed in the second upper planarization layer 149 and the first upper planarization layer 148 and connected to the first electrode 164 of the light-emitting element 160 through a contact hole formed in the second upper planarization layer 149. Therefore, the common line and the first electrode 164 of the light-emitting element 160 are electrically connected.

The second connection pattern 172 electrically connects the driving transistor 150 and the light-emitting element 160. The second connection pattern 172 electrically connects the light-emitting element 160 and the auxiliary line 132 through the contact hole in the second upper planarization layer 149 and electrically connects the light-emitting element 160 and the lower extension line 131 through the contact holes in the first upper planarization layer 148 and the second upper planarization layer 149. That is, the second connection pattern 172 electrically connects the second electrode 165 of the light-emitting element 160, the auxiliary line 132, and the lower extension line 131.

Specifically, the second connection pattern 172 is electrically connected to the second electrode 165 of the light-emitting element 160 through the contact hole in the second upper planarization layer 149, electrically connected to the auxiliary line 132 through another contact hole formed in the second upper planarization layer 149, and electrically connected to the lower extension line 131 through the contact holes in the first upper planarization layer 148 and the second upper planarization layer 149. In this case, as described above, the lower extension line 131 is connected to the drain electrode 154 of the driving transistor 150 through the contact holes formed in the first interlayer insulation layer 144 and the second interlayer insulation layer 145. Therefore, the second connection pattern 172 connected to the lower extension line 131 is also connected to the drain electrode 154 of the driving transistor 160. Therefore, the second connection pattern 172 may electrically connect the driving transistor 150 and the light-emitting element 160. However, the present disclosure is not limited thereto. In accordance with the type of driving transistor 150, the second connection pattern 172 may be connected to the source electrode 153 of the driving transistor 150.

Meanwhile, although not illustrated in the drawings, a bank may be disposed on the second upper planarization layer 149, the first connection pattern 171, and the second connection pattern 172. The bank may be made of an organic insulating material and made of the same material as the lower planarization layer 147. In addition, the bank may be configured to include a black material to suppress a color mixture caused when light emitted from the light-emitting element 160 is transmitted to the adjacent subpixels SPX.

The upper substrate 112 is a substrate configured to support various constituent elements disposed below the upper substrate 112. Specifically, the upper substrate 112 may be formed by coating the lower substrate 111 and the lower plate pattern 121 with a material, which constitutes the upper substrate 112, and curing the material. The upper substrate 112 may be disposed to adjoin the lower substrate 111, the lower plate pattern 121, the lower line pattern 122, and extension lines 181 and 182.

The upper substrate 112 may be made of the same material as the lower substrate 111. For example, the upper substrate 112 may each be made of silicone rubber such as polydimethylsiloxane (PDMS) or elastomer such as polyurethane (PU) and polytetrafluoroethylene (PTFE) and thus have flexibility. However, the material of the upper substrate 112 is not limited thereto.

Meanwhile, although not illustrated in FIG. 3, a polarizing layer may be disposed on the upper substrate 112. The polarizing layer may serve to polarize light entering from the outside of the display device 100 and reduce reflection of external light. In addition, other optical films and the like other than the polarizing layer may be disposed on the upper substrate 112.

In addition, the filling layer 190 may be disposed on the front surface of the lower substrate 111 and fill portions between the constituent elements disposed on the upper substrate 112 and the lower substrate 111. The filling layer 190 may be made of a curable bonding agent. Specifically, the filling layer 190 may be formed by coating the front surface of the lower substrate 111 with a material, which constitutes the filling layer 190, and curing the material. The filling layer 190 may be disposed between the constituent elements disposed on the upper substrate 112 and the lower substrate 111. For example, the filling layer 190 may be an optically clear adhesive (OCA) and made of an acrylic-based bonding agent, a silicon-based bonding agent, a urethane-based bonding agent, and the like.

Hereinafter, a method of manufacturing the display device 100 according to the exemplary embodiment of the present disclosure will be described with reference to FIGS. 4A to 4F.

Method of Manufacturing Display Device According to Exemplary Embodiment of Present Disclosure FIGS. 4A to 4F are cross-sectional views for explaining a method of manufacturing the display device according to the exemplary embodiment of the present disclosure. In this case, FIGS. 4A to 4F are process cross-sectional views for explaining a method of manufacturing the display device 100 according to the exemplary embodiment of the present disclosure illustrated in FIGS. 1 to 3.

Figure 4A:
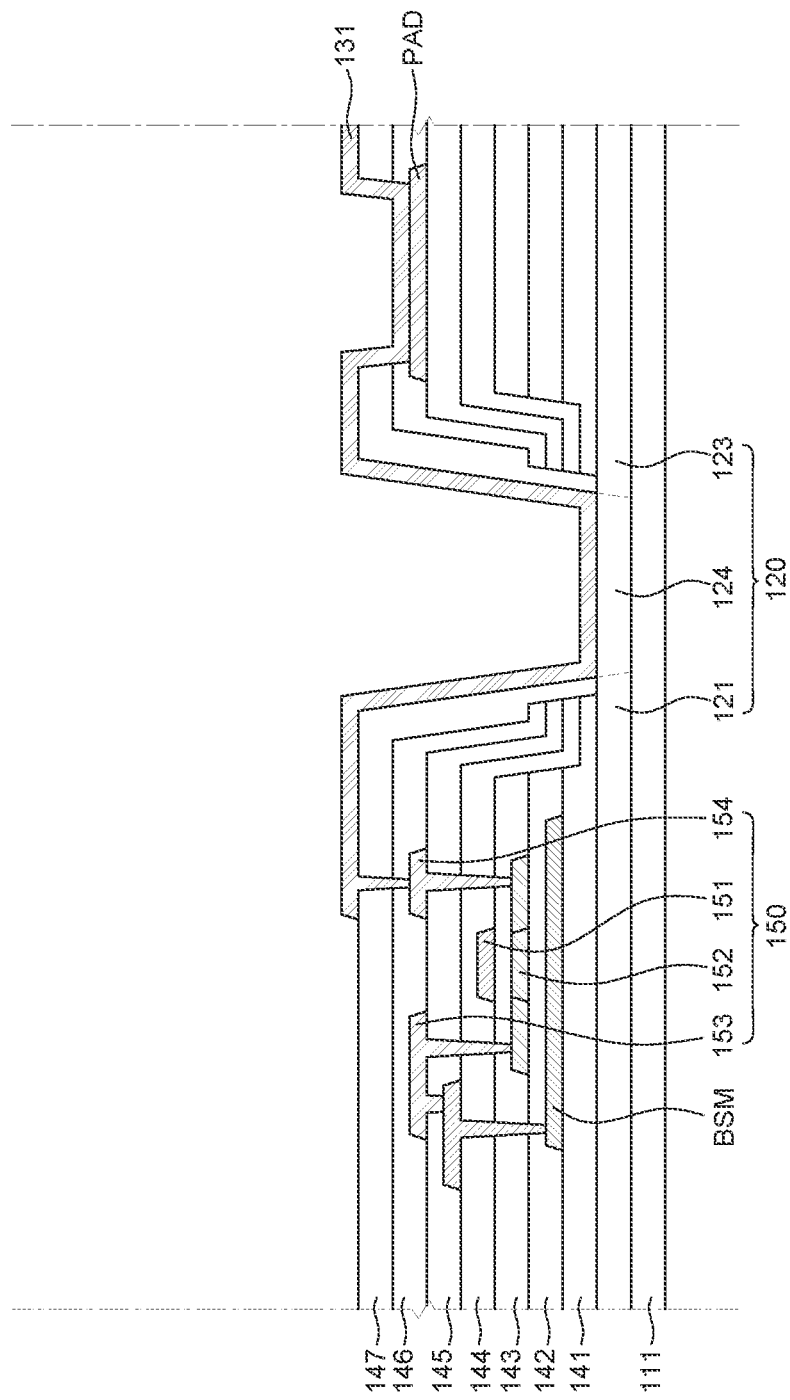
FIGS. 4A to 4F are cross-sectional views for explaining a method of manufacturing the display device according to the exemplary embodiment of the present disclosure.

First, with reference to FIG. 4A, the plurality of lower plate patterns 121, the plurality of outer plate patterns 123, and the plurality of outer line patterns 124 extending from the plurality of lower plate patterns 121 are formed on the stretchable lower substrate 111. In this case, the plurality of lower plate patterns 121, the plurality of outer plate patterns 123, and the plurality of outer line patterns 124 may be more rigid than the lower substrate 111.

Further, the plurality of pixel circuits is respectively formed on the upper portions of the plurality of lower plate patterns 121. The pixel circuit may be configured to operate the light-emitting element 160 and include the driving transistor 150. The plurality of pixel circuits is formed, and then the lower planarization layer 147, which covers the upper portions of the plurality of pixel circuits, is formed. The lower planarization layer 147 may planarize the upper portion of the pixel circuit by covering the upper portions of the plurality of pixel circuits.

Next, the lower extension line 131, which is electrically connected to pixel circuit, is formed on the upper portion of the lower planarization layer 147 and the upper portion of the outer line pattern 124. Specifically, the contact hole, through which the plurality of pixel circuits is partially exposed, is formed in the lower planarization layer 147 formed on the upper portion of each of the plurality of lower plate patterns 121. The plurality of lower extension lines 131, which extends to the upper portions of the plurality of outer line patterns 124 from an upper portion of a part of the exposed pixel circuit, is formed. Therefore, the plurality of lower extension lines 131 may be electrically connected to the pixel circuit.

Figure 4B:
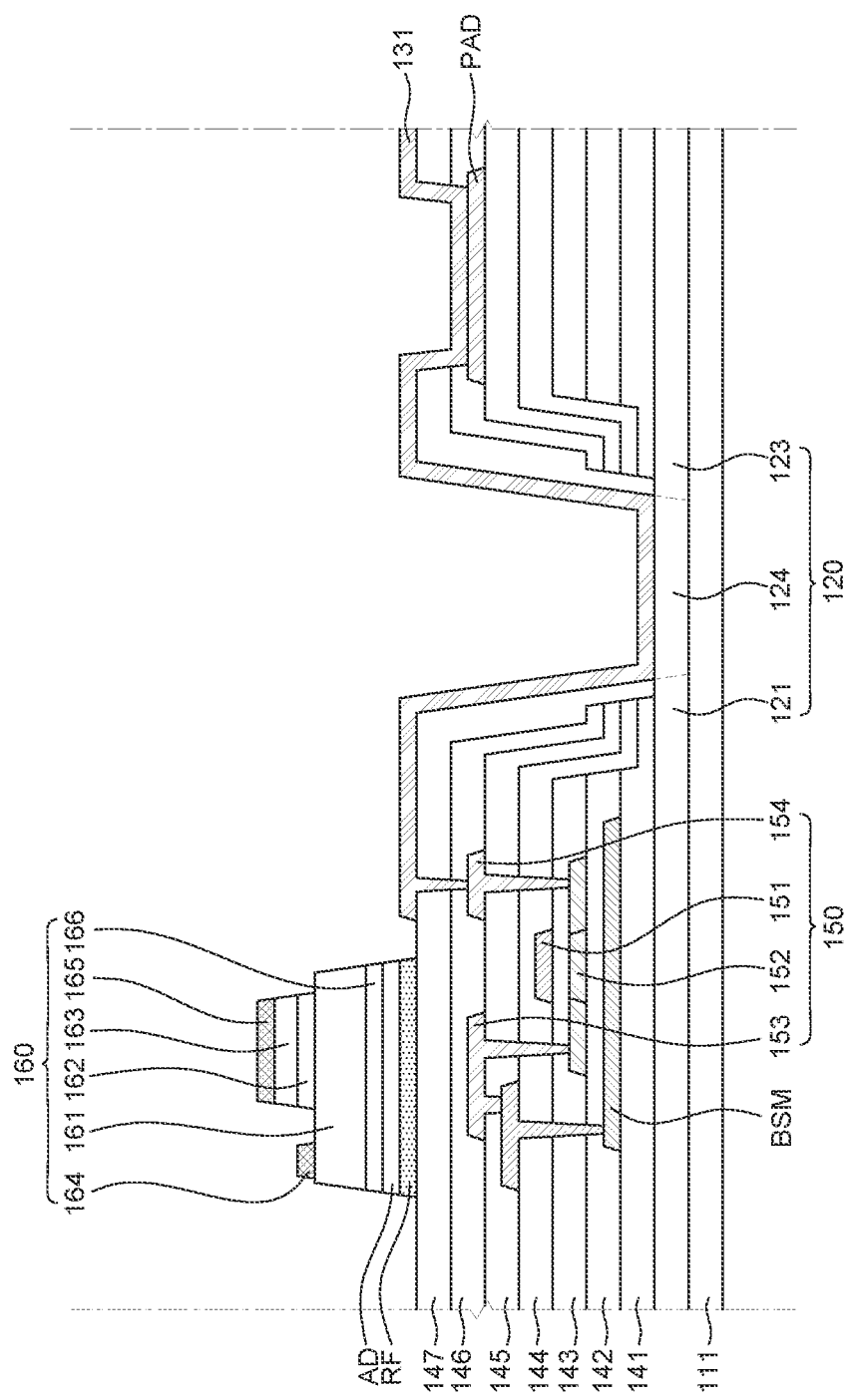

Next, with reference to FIG. 4B, the plurality of light-emitting elements 160 is disposed on the lower planarization layer 147 formed on the upper portions of the plurality of lower plate patterns 121. In this case, the light-emitting element 160 may have a lateral structure in which the first electrode 164 and the active layer 162 are disposed on the upper portion of the first semiconductor layer 161, and the second semiconductor layer 163 and the second electrode 165 are sequentially positioned on the upper portion of the active layer 162.

Figure 4C:
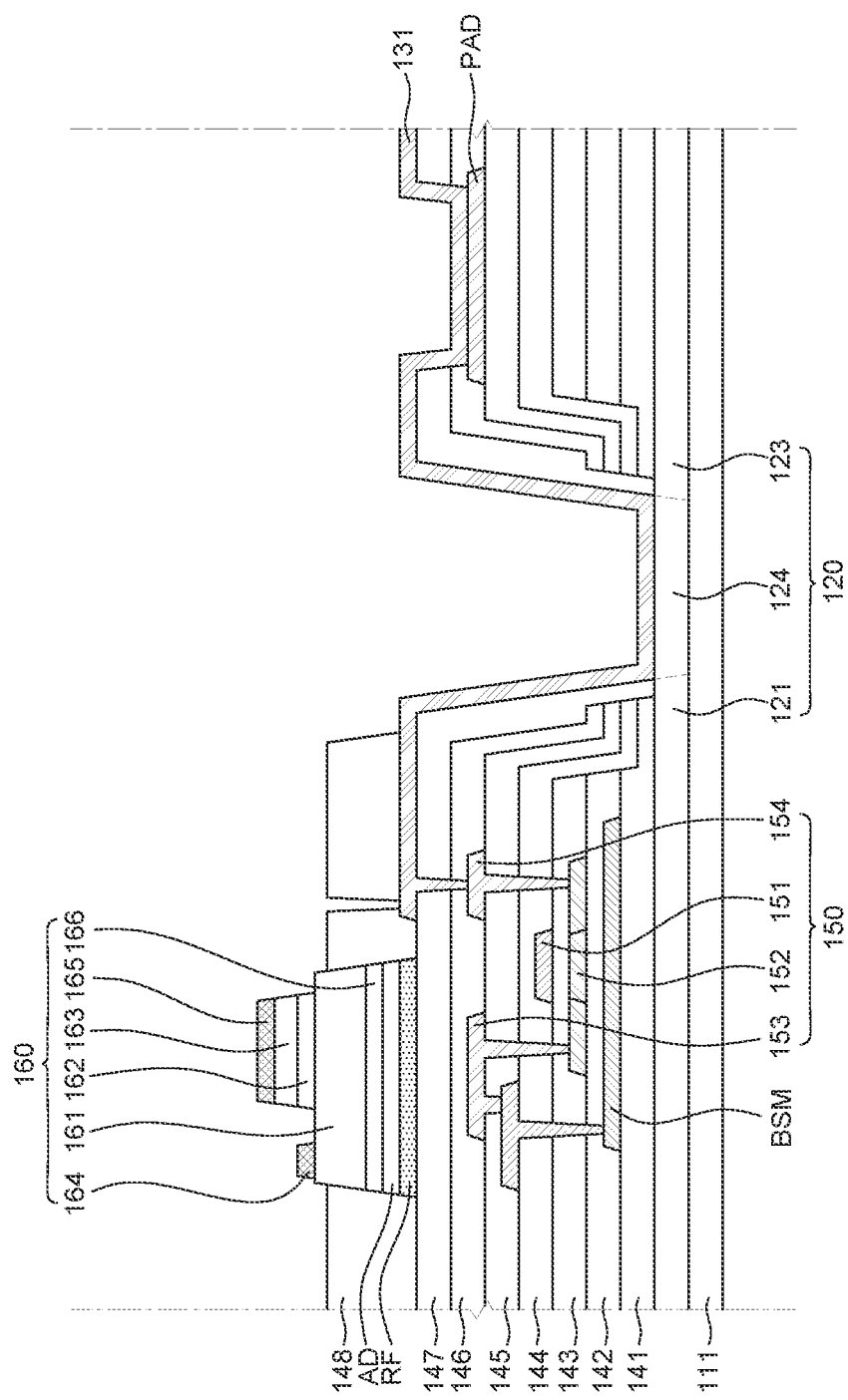
Figure 4D:
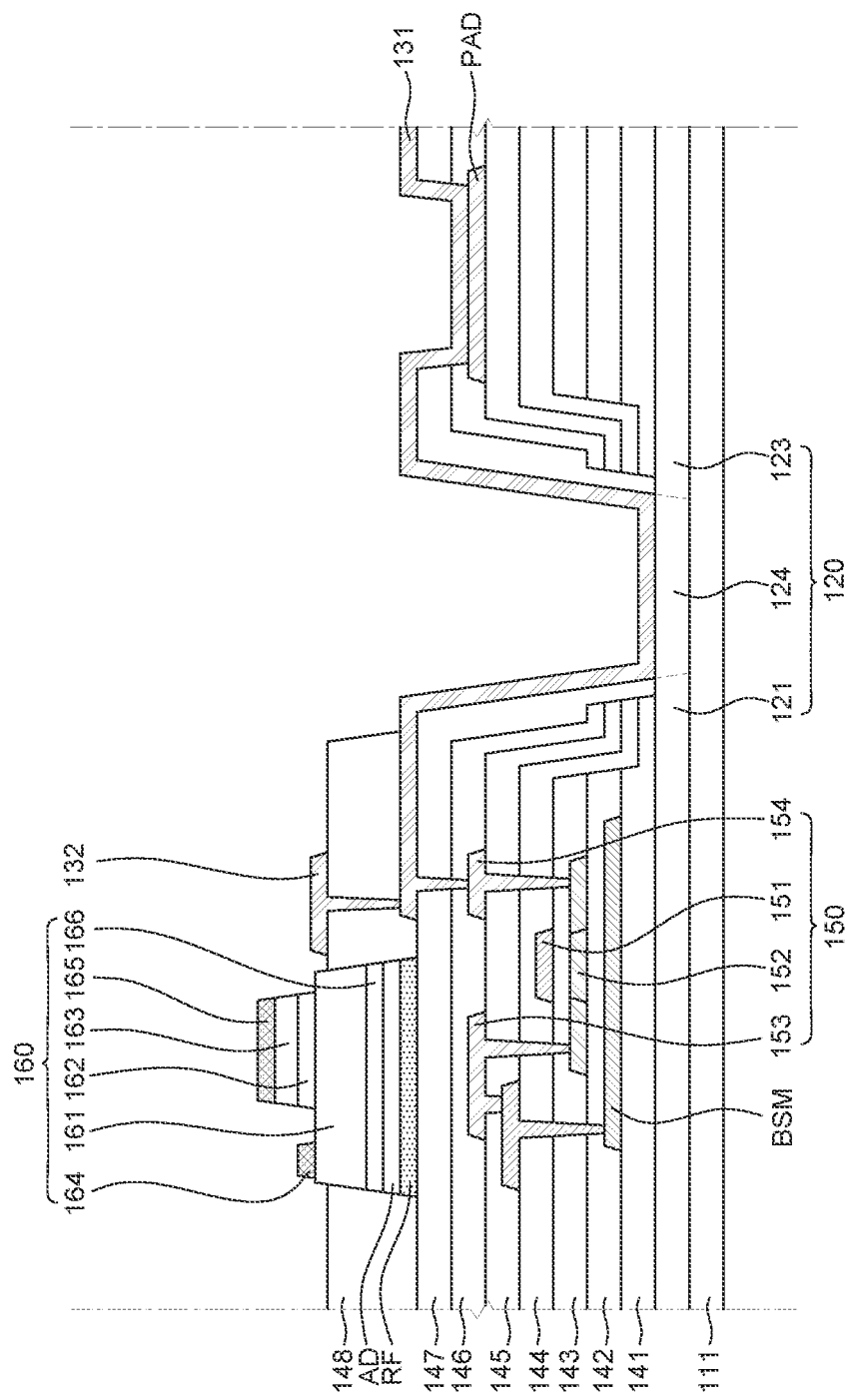

Next, with reference to FIGS. 4C and 4D, the first upper planarization layer 148 is formed on the lower planarization layer 147 so as to surround the side surfaces of the plurality of light-emitting elements 160. Further, the contact hole, through which a part of the lower extension line 131 is exposed, is formed in the first upper planarization layer 148. The auxiliary line 132, which is electrically connected to the lower extension line 131, is formed on the upper portion of the first upper planarization layer 148. Therefore, the auxiliary line 132 may be disposed on a plane different from a plane on which the lower extension line 131 is disposed. Further, the auxiliary line 132 may be electrically connected to the lower extension line 131.

Figure 4E:
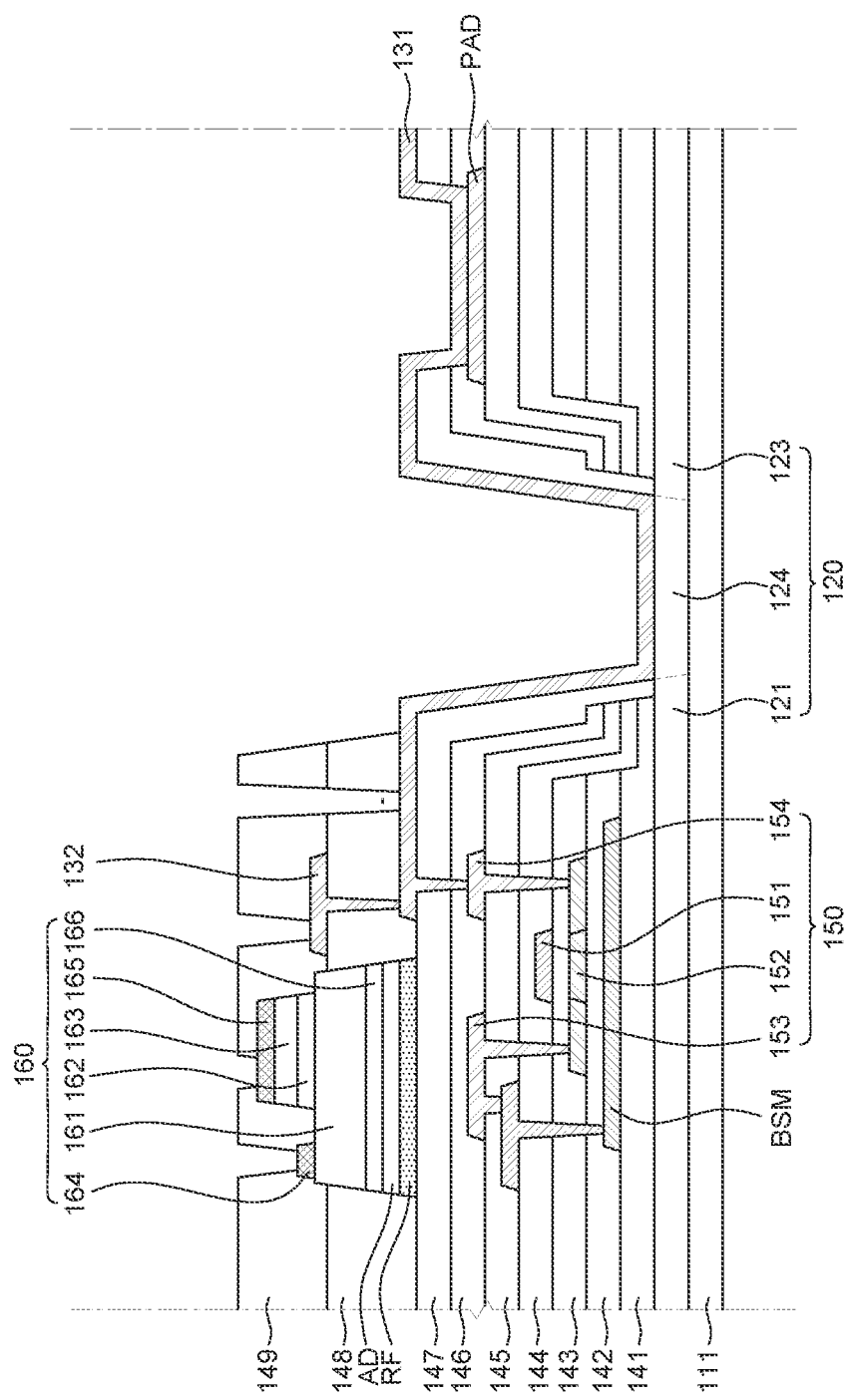
Figure 4F:
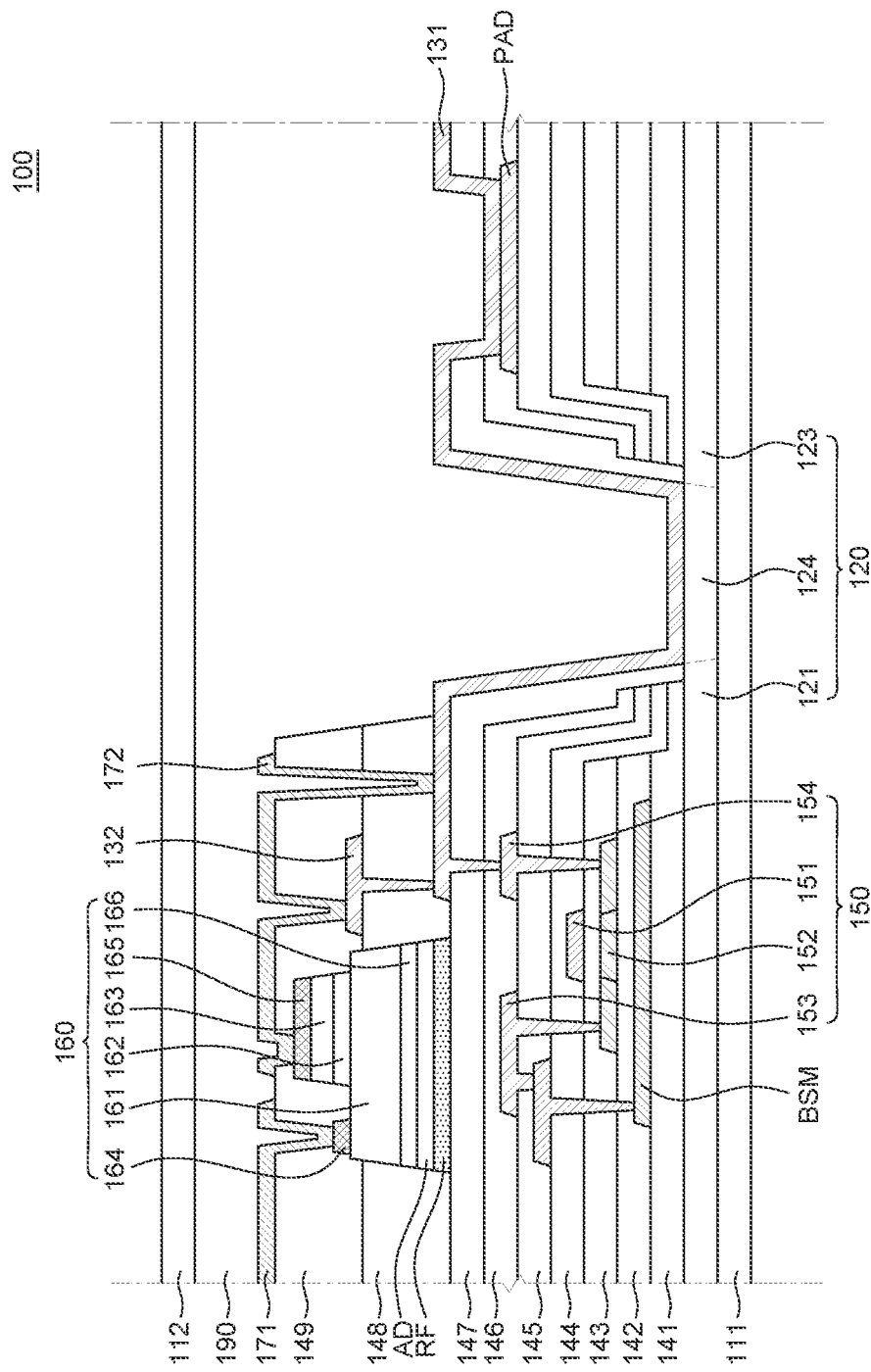

Next, with reference to FIGS. 4E and 4F, the second upper planarization layer 149 is formed to cover the upper portions of the first upper planarization layer 148, the plurality of light-emitting elements 160, and the auxiliary line 132. Further, the contact holes, through which the top surfaces of the plurality of light-emitting elements 160, the auxiliary line 132, and the lower extension line 131 are exposed, are formed. The connection pattern 172 is formed to connect the plurality of light-emitting elements 160, the auxiliary line 132, and the lower extension line 131. Therefore, the connection pattern 172 may be electrically connected to the second electrode 165 of the light-emitting element 160, the auxiliary line 132, and the lower extension line 131.

With reference to FIGS. 1 to 4F, in the display device 100 according to the exemplary embodiment of the present disclosure, the auxiliary line 132 is further disposed on a different plane from the lower extension line 131, thereby improving contact resistance of the extension line disposed on the planarization layer having a high-level difference.

In general, in the case of the light-emitting element that has the lateral structure in which the first electrode and the second electrode are disposed at different heights, the height of the planarization layer for planarizing the upper portion of the light-emitting element may be relatively high in comparison with light-emitting elements having other structures. Therefore, in case that the contact hole is formed in the upper planarization layer of the light-emitting element to dispose the connection pattern that connects the lower extension line connected to the drain electrode of the driving transistor and the second electrode of the light-emitting element, the contact hole of the planarization layer may have a high-level difference because of the high height of the planarization layer. Therefore, there may occur a problem in which the contact resistance of the connection pattern for connecting the extension line and the light-emitting element is increased by the planarization layer having a high-level difference.

Therefore, in the display device 100 according to the exemplary embodiment of the present disclosure, the upper planarization layer for planarizing the upper portion of the light-emitting element 160 is configured as a multilayer including the first upper planarization layer 148 and the second upper planarization layer 149. The auxiliary line 132 electrically connected to the lower extension line 131 is added onto the first upper planarization layer 148. Further, the connection pattern 172, which connects the lower extension line 131 and the second electrode 165 of the light-emitting element 160, is disposed to be additionally connected to the auxiliary line 132 disposed on the different layer from the lower extension line 131. Therefore, it is possible to add a contact point between the connection pattern 172 and the lower extension line 131 and reduce contact resistance caused by the planarization layer having a high-level difference. Therefore, in the display device 100 according to the exemplary embodiment of the present disclosure, the auxiliary line 132 may be further disposed on a different plane from the lower extension line 131, thereby improving the contact resistance of the connection pattern 172 disposed on the planarization layer having a high-level difference, and improving reliability of the display device 100.

Meanwhile, in the display device 100 according to the exemplary embodiment of the present disclosure, the auxiliary line 132 may be further disposed on a layer higher than the lower extension line 131, thereby reducing or minimizing a defect caused by oxidation and corrosion of the lower extension line 131 disposed on the planarization layer having a high-level difference.

In general, in case that the planarization layer having a relatively higher high-level difference needs to be formed to planarize the upper portion of the light-emitting element, a thickness of the planarization layer, which may be formed once during the process of manufacturing the display device, may be restricted. Therefore, to compensate for the insufficient height of the planarization layer, it is beneficial for the process of forming the planarization layer to be repeated multiple times to form the planarization layer configured as a multilayer. In this process, there may occur a problem in which the extension line is corroded or oxidized by the plurality of planarization layer forming processes such as a photocuring process.

Therefore, in the display device 100 according to the exemplary embodiment of the present disclosure, the auxiliary line 132, which is disposed at the layer higher than the lower extension line 131, is added. Therefore, the auxiliary line 132 may protect the lower extension line 131 at the upper portion of the lower extension line 131 during the plurality of planarization layer forming processes, thereby reducing or minimizing corrosion and oxidation of the lower extension line 131. Therefore, in the display device 100 according to the exemplary embodiment of the present disclosure, the auxiliary line 132 may be further disposed on a layer higher than the lower extension line 131, thereby reducing or minimizing a defect caused by corrosion of the lower extension line 131 disposed on the planarization layer having a high-level difference.

Another Embodiment of Present Disclosure

Figure 5:
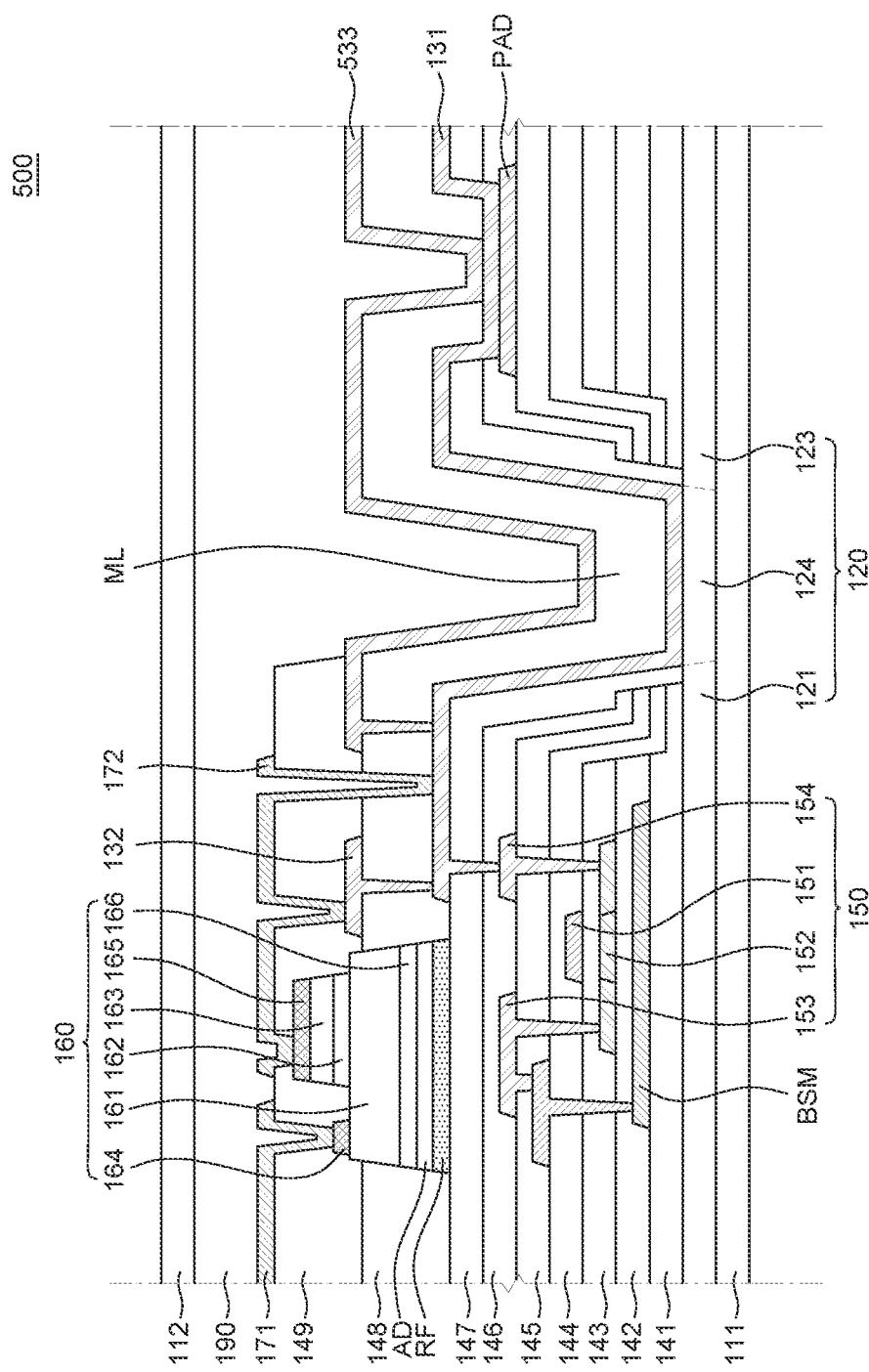
FIG. 5 is a cross-sectional view of a display device according to another exemplary embodiment of the present disclosure.

FIG. 5 is a cross-sectional view of a display device according to another exemplary embodiment of the present disclosure.

A display device 500 in FIG. 5 differs from the display device 100 in FIGS. 1 to 4F only in that an upper extension line 533 and an intermediate layer ML are added. Therefore, repeated descriptions of the identical components will be omitted.

With reference to FIG. 5, the upper extension line 533 may be further disposed on the first upper planarization layer 148. The upper extension line 533 may be disposed on the first upper planarization layer 148 while extending along the lower extension line 131 and electrically connected to the lower extension line 131. Specifically, the upper extension line 533 may be disposed on the upper portion of the outer line pattern 124 along the lower extension line 131. Further, the upper extension line 533 may be disposed on the upper portion of the lower plate pattern 121 and electrically connected to the lower extension line 131 through the contact hole formed in the first upper planarization layer 148. Therefore, in the display device 500 according to another exemplary embodiment of the present disclosure, the extension line may have a multi-structure including the lower extension lines 131.

Meanwhile, with reference to FIG. 3, the upper extension line 533 may be electrically connected once more to the pattern of the lower extension line 131 through the contact hole in the insulation layer disposed on the same layer as the first upper planarization layer 148 and provided on the pad PAD disposed in the non-display area. However, the shape in which the upper extension line 533 and the lower extension line 131 are electrically connected is not limited thereto.

With reference to FIG. 5, the intermediate layer ML may be provided on the upper portion of the outer line pattern 124 and disposed between the lower extension line 131 and the upper extension line 533. The intermediate layer ML may be disposed on the same material as the first upper planarization layer 148. That is, the intermediate layer ML may be formed by the same process as the first upper planarization layer 148. The intermediate layer ML may be formed separately from the first upper planarization layer 148 and made of a material such as polyimide (PI) or other organic materials advantageous in stretching. However, the present disclosure is not limited thereto.

Hereinafter, a method of manufacturing the display device 500 according to another exemplary embodiment of the present disclosure will be described with reference to FIGS. 6A to 6F.

Method of Manufacturing Display Device According to Exemplary Embodiment of Present Disclosure FIGS. 6A to 6F are cross-sectional views for explaining a process of manufacturing the display device according to another exemplary embodiment of the present disclosure. In this case, FIGS. 6A to 6F are process cross-sectional views for explaining a method of manufacturing the display device 500 according to another exemplary embodiment of the present disclosure illustrated in FIGS. 1 to 5.

Figure 6A:
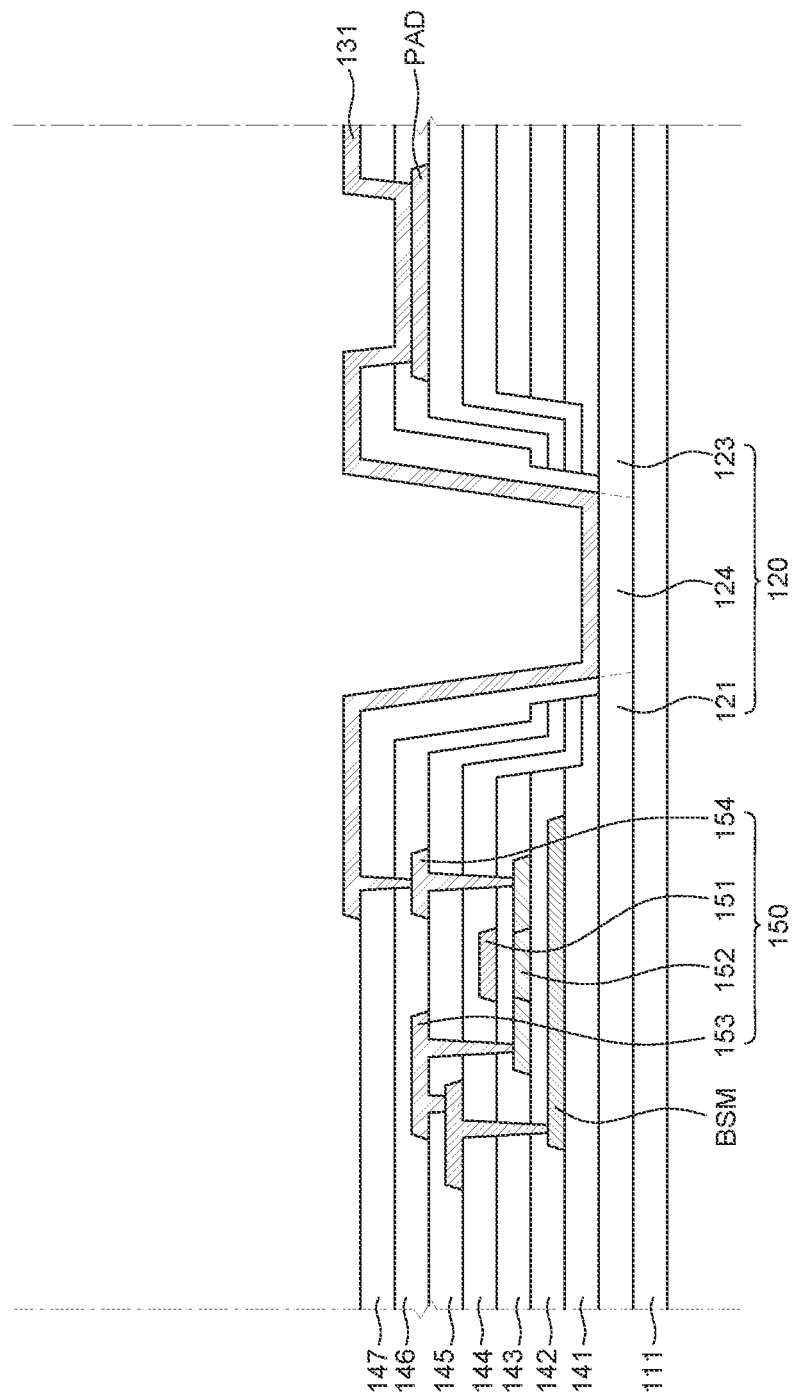
FIGS. 6A to 6F are cross-sectional views for explaining a process of manufacturing the display device according to another exemplary embodiment of the present disclosure.

First, with reference to FIG. 6A, the plurality of lower plate patterns 121, the plurality of outer plate patterns 123, and the plurality of outer line patterns 124 extending from the plurality of lower plate patterns 121 are formed on the stretchable lower substrate 111. In this case, the plurality of lower plate patterns 121, the plurality of outer plate patterns 123, and the plurality of lower line patterns 124 may be more rigid than the lower substrate 111.

Further, the plurality of pixel circuits is respectively formed on the upper portions of the plurality of lower plate patterns 121. The pixel circuit may be configured to operate the light-emitting element 160 and include the driving transistor 150. The plurality of pixel circuits is formed, and then the lower planarization layer 147, which covers the upper portions of the plurality of pixel circuits, is formed.

The lower planarization layer 147 may planarize the upper portion of the pixel circuit by covering the upper portions of the plurality of pixel circuits.

Next, the lower extension line 131, which is electrically connected to pixel circuit, is formed on the upper portion of the lower planarization layer 147 and the upper portion of the outer line pattern 124. Specifically, the contact hole, through which the plurality of pixel circuits is partially exposed, is formed in the lower planarization layer 147 formed on the upper portion of each of the plurality of lower plate patterns 121. The plurality of lower extension lines 131, which extends to the upper portions of the plurality of outer line patterns 124 from an upper portion of a part of the exposed pixel circuit, is formed. Therefore, the plurality of lower extension lines 131 may be electrically connected to the pixel circuit.

Figure 6B:
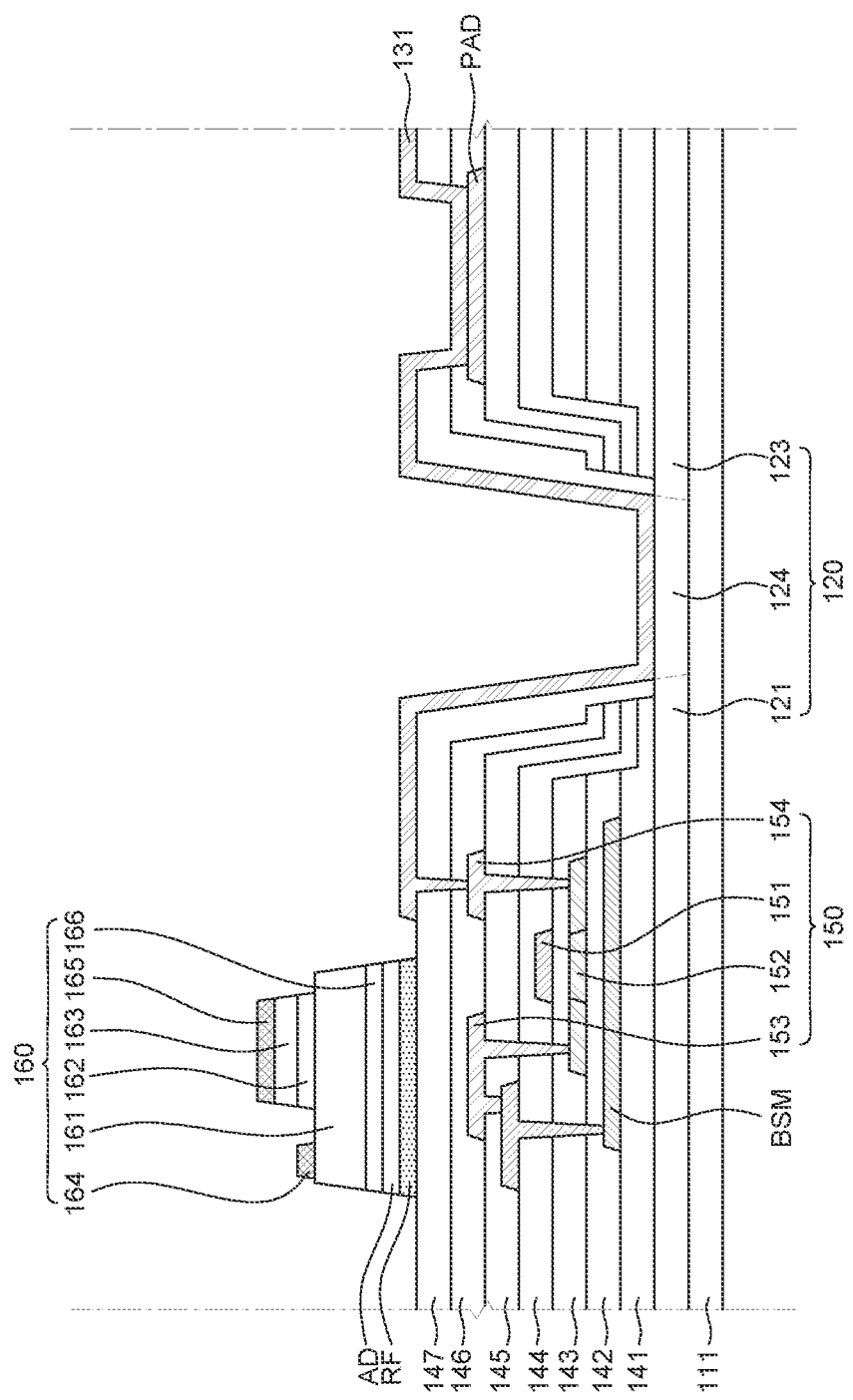

Next, with reference to FIG. 6B, the plurality of light-emitting elements 160 is disposed on the lower planarization layer 147 formed on the upper portions of the plurality of lower plate patterns 121. In this case, the light-emitting element 160 may have a lateral structure in which the first electrode 166 and the active layer 162 are disposed on the upper portion of the first semiconductor layer 161, and the second semiconductor layer 163 and the second electrode 165 are sequentially positioned on the upper portion of the active layer 162.

Figure 6C:
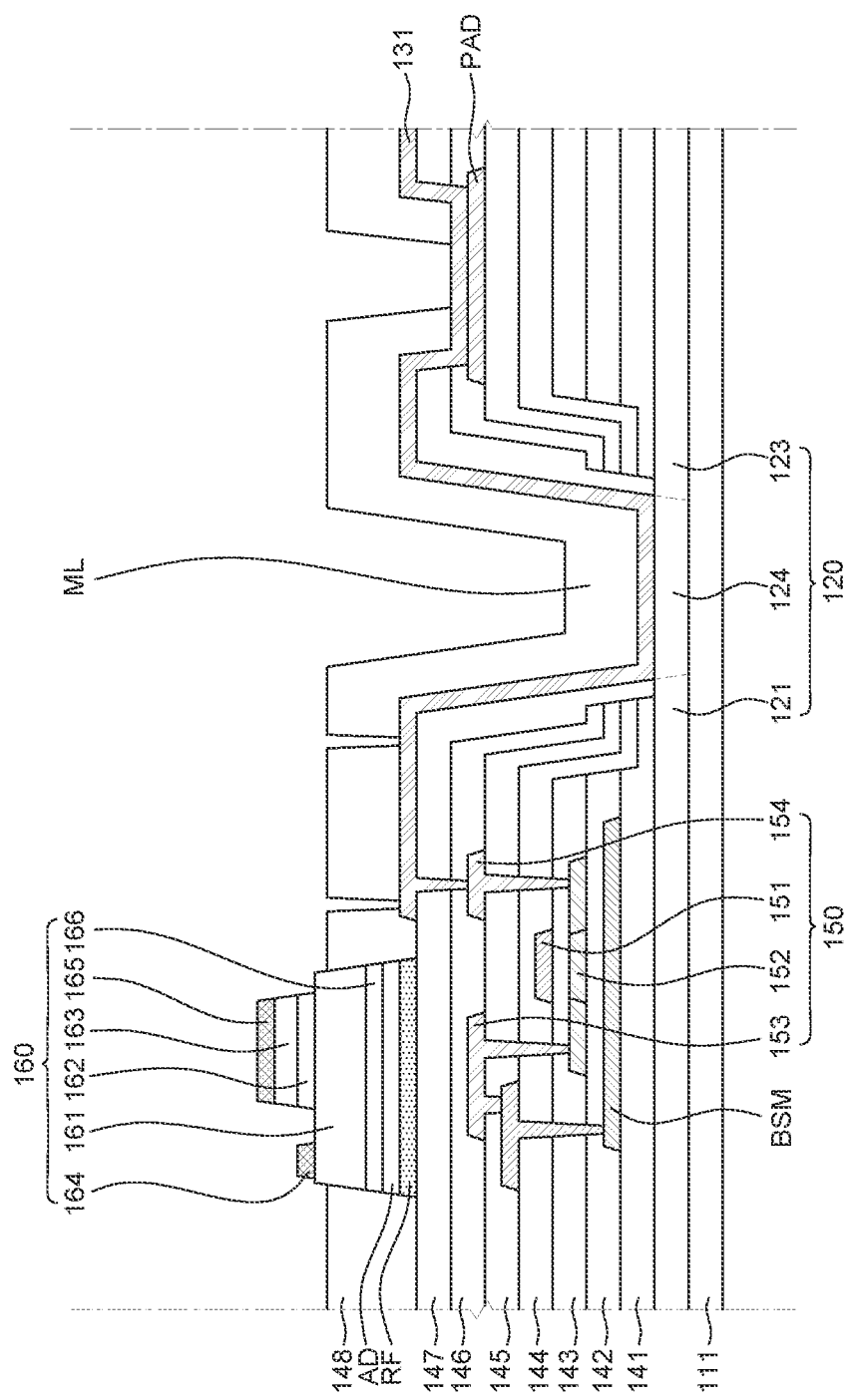
Figure 6D:
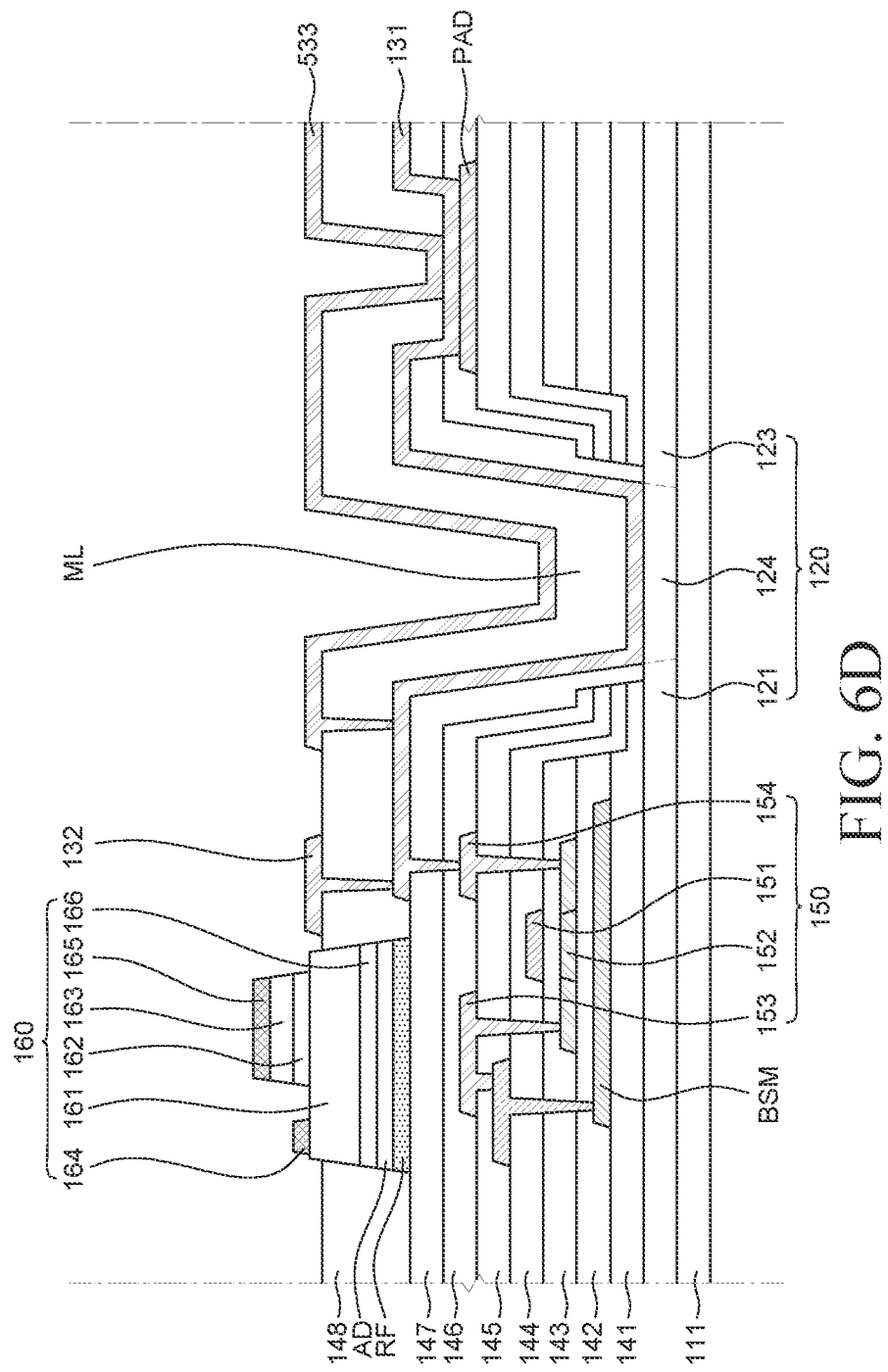

Next, with reference to FIGS. 6C and 6D, the first upper planarization layer 148 is formed on the lower planarization layer 147 so as to surround the side surfaces of the plurality of light-emitting elements 160. Further, the contact hole, through which a part of the lower extension line 131 is exposed, is formed in the first upper planarization layer 148. The auxiliary line 132, which is electrically connected to the lower extension line 131, is formed on the upper portion of the first upper planarization layer 148. In this case, the upper extension line 533, which is disposed along the lower extension line 131, is formed at the same time when the auxiliary line 132 is formed. The contact hole, through which a part of the lower extension line 131 is exposed, is formed in the first upper planarization layer 148, such that the extension line is disposed on the upper portion of the first upper planarization layer 147 and electrically connected to the lower extension line 131. Therefore, the auxiliary line 132 and the upper extension line 533 may be formed by the same process and disposed on the same layer. Therefore, the auxiliary line 132 and the upper extension line 533 may be disposed on the plane different from the plane on which the lower extension line 131 is disposed. Further, the auxiliary line 132 and the upper extension line 533 may be electrically connected to the lower extension line 131.

Figure 6E:
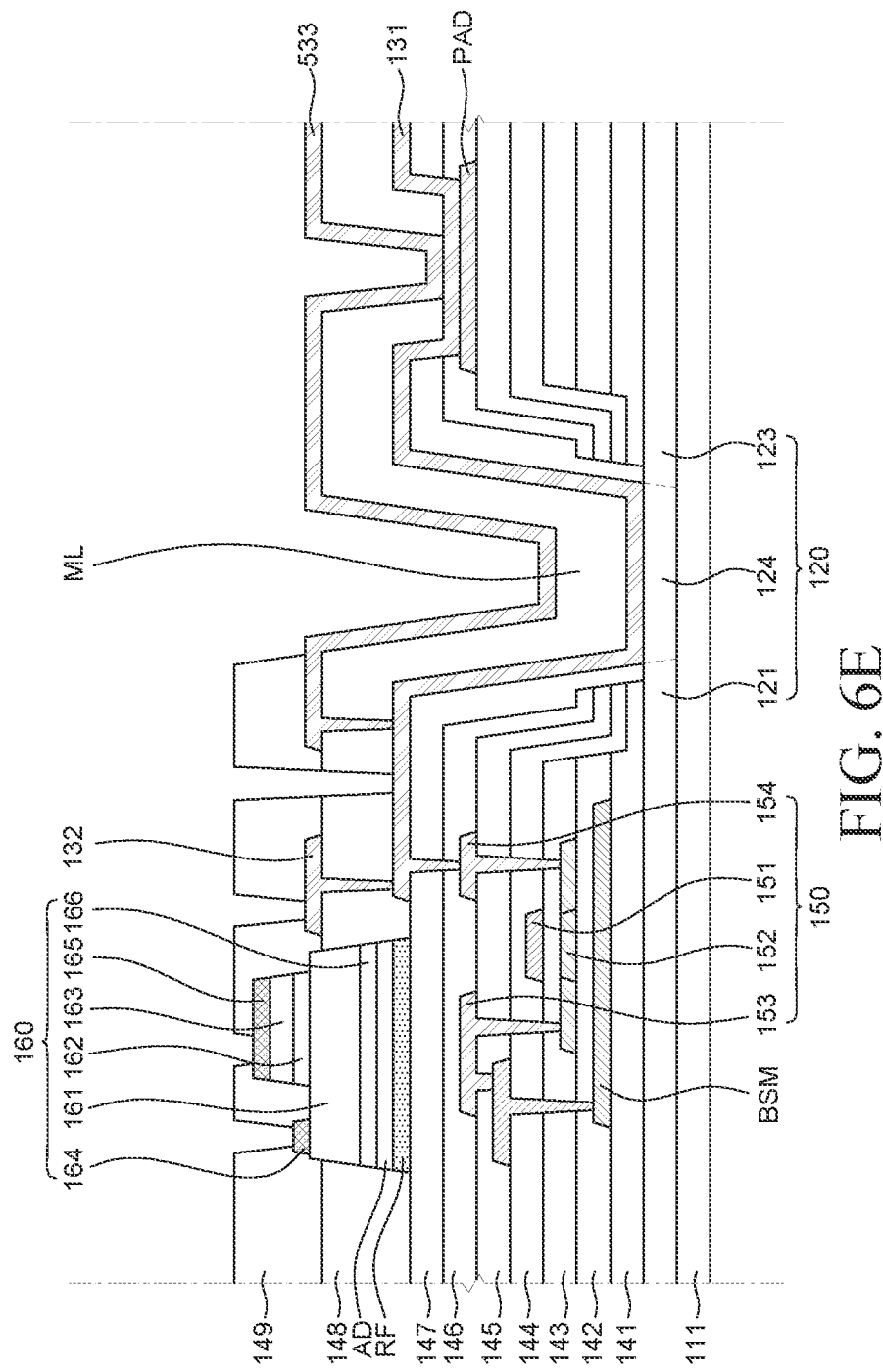
Figure 6F:
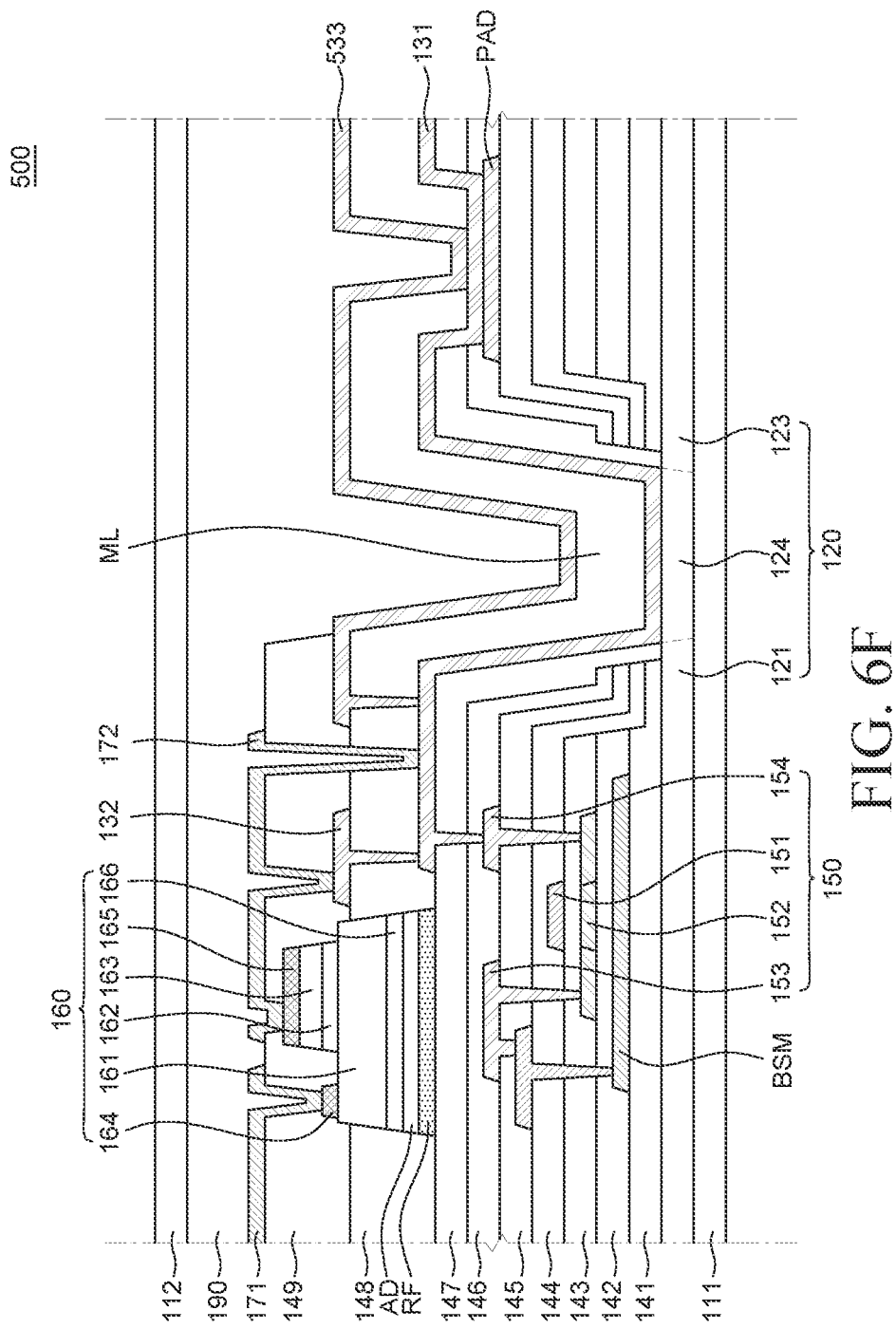

Next, with reference to FIGS. 6E and 6F, the second upper planarization layer 149 is formed to cover the upper portion of the first upper planarization layer 148, the upper portions of the plurality of light-emitting elements 160, the upper portion of the auxiliary line 132, and the upper portion of the upper extension line 533. Further, the contact holes, through which the top surfaces of the plurality of light-emitting elements 160, the auxiliary line 132, and the lower extension line 131 are exposed, are formed. The connection pattern 172 is formed to connect the plurality of light-emitting elements 160, the auxiliary line 132, and the lower extension line 131. Therefore, the connection pattern 172 may be electrically connected to the second electrode 165 of the light-emitting element 160, the auxiliary line 132, and the lower extension line 131.

With reference to FIGS. 5 to 6F, in the display device 500 according to another exemplary embodiment of the present disclosure, the upper extension line 533 is further disposed on the plane different from the plane on the lower extension line 131 is disposed, such that the multi-structure including the extension lines may be disposed, thereby reducing resistance of the extension line.

Specifically, with reference to FIG. 5, in the display device 500 according to another exemplary embodiment of the present disclosure, the upper extension line 533 is further disposed on the plane different from the plane on which the lower extension line 131 is disposed, such that the multi-structure including the extension lines is disposed. Further, as illustrated in FIG. 5, the lower extension line 131 may be electrically connected to the upper extension line 533, such that resistance of the lower extension line 131 may decrease. Therefore, in the display device 500 according to another exemplary embodiment of the present disclosure, the upper extension line 533 is further disposed on the layer different from the layer on which the lower extension line 131 is disposed, such that the multi-structure including the extension lines is disposed, such that it is possible to reduce resistance of the extension line and improve reliability of the extension line.

In addition, in the display device 500 according to another exemplary embodiment of the present disclosure, the intermediate layer ML is disposed between the lower extension line 131 and the upper extension line 533, such that it is possible to mitigate impact applied to the lower extension line 131 and the upper extension line 533 during the process of stretching the display device 500.

Specifically, with reference to FIG. 5, in the display device 500 according to another exemplary embodiment of the present disclosure, the intermediate layer ML, which is made of a material advantageous in stretching, is disposed between the lower extension line 131 and the upper extension line 533. Therefore, during the process of stretching the display device 500, the intermediate layer ML may be stretched together with the lower extension line 131 and the upper extension line 533, thereby mitigating impact applied between the lower extension line 131 and the upper extension line 533. Therefore, in the display device 500 according to another exemplary embodiment of the present disclosure, the intermediate layer ML is disposed between the lower extension line 131 and the upper extension line 533, it is possible to mitigate impact applied to the lower extension line 131 and the upper extension line 533 during the stretching operation, thereby reducing or minimizing damage to the lower extension line 131 and the upper extension line 533.

The exemplary embodiments of the present disclosure can also be described as follows:

According to an aspect of the present disclosure, a display device includes: a stretchable lower substrate; a lower pattern layer disposed on the lower substrate and including a plurality of lower plate patterns, and a plurality of lower line patterns extending from the plurality of lower plate patterns; a plurality of pixel circuits respectively disposed on upper portions of the plurality of lower plate patterns; a lower planarization layer disposed on the plurality of pixel circuits; a plurality of light-emitting elements disposed on the lower planarization layer and respectively connected to the plurality of pixel circuits; a lower extension line disposed on the lower planarization layer while extending to an upper portion of the lower line pattern and electrically connected to the pixel circuit; a first upper planarization layer disposed on the lower planarization layer so as to surround side surfaces of the plurality of light-emitting elements; an auxiliary line disposed on the first upper planarization layer and electrically connected to the lower extension line through a contact hole in the first upper planarization layer; a second upper planarization layer disposed on the first upper planarization layer and configured to planarize an upper portion of the light-emitting element; and a connection pattern configured to electrically connect the light-emitting element and the auxiliary line through a contact hole in the second upper planarization layer, and electrically connect the light-emitting element and the lower extension line through contact holes in the first upper planarization layer and the second upper planarization layer.

The light-emitting element may comprise a first semiconductor layer, an active layer disposed on the first semiconductor layer, a first electrode disposed on the first semiconductor layer spaced apart from the active layer, a second semiconductor layer disposed on the active layer, and a second electrode disposed on the second semiconductor layer.

The connection pattern may electrically connect the second electrode, the auxiliary line, and the lower extension line.

The display device further comprise a reflective layer disposed on a lower portion of the first semiconductor layer, and a bonding layer configured to bond the reflective layer and the first semiconductor layer.

The lower substrate may further comprise a display area, and a non-display area in which a plurality of pads is disposed.

A plurality of lower extension patterns may be electrically connected to the plurality of pads.

The display device may further comprise an upper extension line disposed on the first upper planarization layer while extending along the lower extension line and electrically connected to the lower extension line.

The upper extension line may be electrically connected to the lower extension line through a contact hole in the first upper planarization layer.

The display device may further comprise an intermediate layer provided on an upper portion of the lower line pattern and disposed between the lower extension line and the upper extension line.

The intermediate layer may be made of the same material as the first upper planarization layer.

According to another aspect of the present disclosure, a method of manufacturing a display device includes: forming a plurality of lower plate patterns and a plurality of lower line patterns on a stretchable lower substrate, the plurality of lower line patterns extending from the plurality of lower plate patterns; forming a plurality of pixel circuits and a lower planarization layer on upper portions of the plurality of lower plate patterns, the lower planarization layer being configured to cover the plurality of pixel circuits; forming a contact hole, through which some of the plurality of pixel circuits are exposed, in the lower planarization layer formed on the upper portions of the plurality of lower plate patterns, and forming a plurality of lower extension lines extending from an upper portion of a part of the exposed pixel circuit to the upper portions of the plurality of lower line patterns; disposing a plurality of light-emitting elements on the lower planarization layer formed on the upper portions of the plurality of lower plate patterns; forming a first upper planarization layer on the lower planarization layer to surround side surfaces of the plurality of light-emitting elements; forming a contact hole, through which a part of the lower extension line is exposed, in the first upper planarization layer, and forming an auxiliary line disposed on the first upper planarization layer and electrically connected to the lower extension line; forming a second upper planarization layer configured to cover an upper portion of the first upper planarization layer, upper portions of the plurality of light-emitting elements, and an upper portion of the auxiliary line; and forming a contact hole through which top surfaces of the plurality of light-emitting elements, a top surface of the auxiliary line, and a top surface of the lower extension line are exposed, and forming a connection pattern configured to connect the plurality of light-emitting elements, the auxiliary line, and the lower extension line.

The forming of the auxiliary line may comprise forming an upper extension line disposed along the lower extension line together with the auxiliary line.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A display device comprising:
a stretchable lower substrate;
a lower pattern layer disposed on the stretchable lower substrate and comprising a plurality of lower plate patterns, and a plurality of lower line patterns extending from the plurality of lower plate patterns;
a plurality of pixel circuits respectively disposed on upper portions of the plurality of lower plate patterns;
a lower planarization layer disposed on the plurality of pixel circuits;
a plurality of light-emitting elements disposed on the lower planarization layer and respectively coupled to the plurality of pixel circuits;
a lower extension line disposed on the lower planarization layer while extending to an upper portion of the lower line pattern and electrically connected to the pixel circuit;
a first upper planarization layer disposed on the lower planarization layer and surrounds side surfaces of the plurality of light-emitting elements;
an auxiliary line disposed on the first upper planarization layer and electrically connected to the lower extension line through a contact hole in the first upper planarization layer;
a second upper planarization layer disposed on the first upper planarization layer; and
a connection pattern configured to electrically connect the light-emitting element and the auxiliary line through a contact hole in the second upper planarization layer, and electrically connect the light-emitting element and the lower extension line through contact holes in the first upper planarization layer and the second upper planarization layer.

2. The display device of claim 1, wherein the light-emitting element comprises:
a first semiconductor layer;
an active layer disposed on the first semiconductor layer;
a first electrode disposed on the first semiconductor layer spaced apart from the active layer;
a second semiconductor layer disposed on the active layer; and
a second electrode disposed on the second semiconductor layer.

3. The display device of claim 2, wherein the connection pattern electrically connects the second electrode, the auxiliary line, and the lower extension line.

4. The display device of claim 2, further comprising:
a reflective layer disposed on a lower portion of the first semiconductor layer; and
a bonding layer configured to bond the reflective layer and the first semiconductor layer.

5. The display device of claim 1, wherein the stretchable lower substrate further comprises a display area, and a non-display area in which a plurality of pads is disposed, and
wherein a plurality of lower extension patterns is electrically connected to the plurality of pads.

6. The display device of claim 1, further comprising:
an upper extension line disposed on the first upper planarization layer while extending along the lower extension line and electrically connected to the lower extension line.

7. The display device of claim 6, wherein the upper extension line is electrically connected to the lower extension line through a contact hole in the first upper planarization layer.

8. The display device of claim 6, further comprising:
an intermediate layer provided on an upper portion of the lower line pattern and disposed between the lower extension line and the upper extension line.

9. The display device of claim 8, wherein the intermediate layer is made of a same material as the first upper planarization layer.

10. A method of manufacturing a display device, the method comprising:
forming a plurality of lower plate patterns and a plurality of lower line patterns on a stretchable lower substrate, the plurality of lower line patterns extending from the plurality of lower plate patterns;
forming a plurality of pixel circuits and a lower planarization layer on upper portions of the plurality of lower plate patterns, the lower planarization layer being configured to cover the plurality of pixel circuits;
forming a contact hole, through which some of the plurality of pixel circuits are exposed, in the lower planarization layer formed on the upper portions of the plurality of lower plate patterns, and forming a plurality of lower extension lines extending from an upper portion of a part of the exposed pixel circuit to the upper portions of the plurality of lower line patterns;

disposing a plurality of light-emitting elements on the lower planarization layer formed on the upper portions of the plurality of lower plate patterns;

forming a first upper planarization layer on the lower planarization layer to surround side surfaces of the plurality of light-emitting elements;

forming a contact hole, through which a part of the lower extension line is exposed, in the first upper planarization layer, and forming an auxiliary line disposed on the first upper planarization layer and electrically connected to the lower extension line;

forming a second upper planarization layer configured to cover an upper portion of the first upper planarization layer, upper portions of the plurality of light-emitting elements, and an upper portion of the auxiliary line; and forming a contact hole through which top surfaces of the plurality of light-emitting elements, a top surface of the auxiliary line, and a top surface of the lower extension line are exposed, and forming a connection pattern configured to couple the plurality of light-emitting elements, the auxiliary line, and the lower extension line.

11. The method of manufacturing a display device of claim 10, wherein the forming of the auxiliary line comprises forming an upper extension line disposed along the lower extension line together with the auxiliary line.

12. A display device comprising:
a substrate on which a plurality of subpixels are defined;
a plurality of pixel circuits respectively disposed in each of the plurality of subpixels;
a lower planarization layer disposed on the plurality of pixel circuits;
a plurality of light-emitting elements disposed on the lower planarization layer and respectively connected to the plurality of pixel circuits;
an extension line transmitting gate voltages to the plurality of subpixels, respectively;
a first upper planarization layer disposed on the lower planarization layer and surrounding a lower portion of side surfaces of a light-emitting element of each of the plurality subpixels;
an auxiliary line disposed on the first upper planarization layer and electrically connected to the extension line through a first contact hole in the first upper planarization layer;
a second upper planarization layer disposed on the first upper planarization layer and configured to planarize an upper surface of the light-emitting element; and
a connection pattern configured to electrically connect the light-emitting element and the auxiliary line through a second contact hole in the second upper planarization layer.

13. The display device of claim 12, wherein the lower extension line is disposed on a portion of the lower planarization layer, and the connection pattern is electrically connected to the lower extension line disposed on the lower planarization layer through a third contact hole in the first upper planarization layer and the second upper planarization layer.

14. The display device of claim 12, wherein the substrate comprises a display area, and a non-display area in which a pad is disposed, and
wherein extension line is electrically connected to the pad.

* * * * *